(12) United States Patent  
Coleman et al.

(10) Patent No.: US 8,295,972 B2
(45) Date of Patent: Oct. 23, 2012

(54) HIGH PERFORMANCE MILLING

(75) Inventors: Glenn Coleman, Cave Creek, AZ (US); Evan C. Sherbrooke, Moorpark, CA (US)

(73) Assignee: Celeritive Technologies, Inc., Cave Creek, AZ (US)

( * ) Notice: Subject to any disclaimer, the term of this patent is extended or adjusted under 35 U.S.C. 154(b) by 259 days.

(21) Appl. No.: 12/575,333

(22) Filed: Oct. 7, 2009

(65) Prior Publication Data

US 2010/0087949 A1   Apr. 8, 2010

Related U.S. Application Data

(60) Provisional application No. 61/103,515, filed on Oct. 7, 2008, provisional application No. 61/103,869, filed on Oct. 8, 2008.

(51) Int. Cl.
*G06F 19/00* (2006.01)
*G05B 19/19* (2006.01)

(52) U.S. Cl. .................. 700/186; 700/173; 700/190

(58) Field of Classification Search .............. 700/159, 700/160, 173, 176, 183, 186, 187, 189, 190, 700/192, 193
See application file for complete search history.

(56) References Cited

U.S. PATENT DOCUMENTS

| | | | |
|---|---|---|---|
| 4,907,164 A | 3/1990 | Guyder | |
| 5,444,636 A | 8/1995 | Yoshida et al. | |
| 5,532,933 A | 7/1996 | Nakata | |
| 6,266,572 B1 | 7/2001 | Yamazaki et al. | |
| 6,428,252 B1 | 8/2002 | Oldani | |
| 6,438,445 B1 | 8/2002 | Yoshida et al. | |
| 6,447,223 B1 | 9/2002 | Farah et al. | |
| 6,535,788 B1 | 3/2003 | Yoshida et al. | |
| 6,591,158 B1 | 7/2003 | Bieterman et al. | |
| 6,745,100 B1 | 6/2004 | Lermuzeaux | |
| 6,772,039 B2 | 8/2004 | Kakino et al. | |
| 6,823,230 B1 * | 11/2004 | Jamalabad et al. | 700/182 |
| 6,824,336 B2 | 11/2004 | Izutsu et al. | |
| 6,895,299 B2 | 5/2005 | Red et al. | |
| 6,942,436 B2 | 9/2005 | Kakino et al. | |
| 6,999,843 B2 | 2/2006 | Matsumoto et al. | |
| 7,069,108 B2 * | 6/2006 | Saarela et al. | 700/193 |
| 7,070,368 B2 | 7/2006 | Murakami et al. | |
| 7,269,471 B2 | 9/2007 | Kadono | |
| 7,451,013 B2 | 11/2008 | Coleman et al. | |

(Continued)

OTHER PUBLICATIONS

Brandt, et al., "Continuous Skeleton Computation by Voronoi Diagram," CVGIP: Image Understanding, May 1992, pp. 329-338, vol. 55, No. 3.

(Continued)

*Primary Examiner* — Charles Kasenge
(74) *Attorney, Agent, or Firm* — Perkins Coie LLP

(57) ABSTRACT

Technology for milling selected portions of a workpiece by a cutting tool of a numerical control machine is described. The described technology can receive a main toolpath, the main toolpath comprising one or more cuts; compute one or more transition toolpaths, each transition toolpath defining a transition area intersecting one or more of the cuts of the main toolpath; trim one or more cuts of the main toolpath near two or more points of intersection between the main toolpath and the transition toolpaths; connect the trimmed portions of the main toolpath with one or more connecting moves such that each connecting move is mostly inside one or more of the transition areas; and mill the selected portions of the workpiece by moving the cutting tool in accordance with the cuts, transition toolpaths, trimmed cuts, and connecting moves.

23 Claims, 20 Drawing Sheets

U.S. PATENT DOCUMENTS

| | | | | |
|---|---|---|---|---|
| 7,577,490 B2* | 8/2009 | Diehl et al. | | 700/173 |
| 7,593,786 B2* | 9/2009 | Saarela et al. | | 700/193 |
| 7,831,332 B2* | 11/2010 | Diehl | | 700/190 |
| 2005/0246052 A1* | 11/2005 | Coleman et al. | | 700/188 |
| 2005/0256604 A1* | 11/2005 | Diehi et al. | | 700/159 |
| 2008/0269943 A1* | 10/2008 | Diehl et al. | | 700/190 |

OTHER PUBLICATIONS

Choy, et al., "A corner-looping based tool path for pocket milling," Computer-Aided Design, Feb. 2003, pp. 155-166, vol. 35, No. 2.

Elber, et al., "MATHSM: Medial Axis Transform toward High Speed Machining of Pockets," Dec. 31, 2003, 16 pages.

Held, et al., "A smooth spiral tool path for high speed machining of 2D pockets," Computer-Aided Design, Jul. 2009, pp. 539-550, vol. 41, No. 7.

Held, et al., "Pocket machining based on contour-parallel tool paths generated by means of proximity maps," Computer-Aided Design, Mar. 1994, pp. 189-203, vol. 26, No. 3.

Held, M., "Foreward, Table of Contents," On the Computational Geometry of Pocket Machining, 1991, 10 pages, Springer-Verlag, Germany.

Held, M., "Chapter 1: Introduction," On the Computational Geometry of Pocket Machining, 1991, pp. 1-16, Springer-Verlag, Germany.

Held, M., "Chapter 2: Survey of Contour-parallel Milling," On the Computational Geometry of Pocket Machining, 1991, pp. 17-36, Springer-Verlag, Germany.

Held, M., "Chapter 3: Survey of Direction-parallel Milling," On the Computational Geometry of Pocket Machining, 1991, pp. 37-52, Springer-Verlag, Germany.

Held, M., "Chapter 4: Preliminaries," On the Computational Geometry of Pocket Machining, 1991, pp. 53-60, Springer-Verlag, Germany.

Held, M., "Chapter 5: Computing Voronoi Diagrams," On the Computational Geometry of Pocket Machining, 1991, pp. 61-88, Springer-Verlag, Germany.

Held, M., "Chapter 6: Implementation Issues," On the Computational Geometry of Pocket Machining, 1991, pp. 89-101, Springer-Verlag, Germany.

Held, M., "Chapter 7: The Concept of Monotonous," On the Computational Geometry of Pocket Machining, 1991, pp. 103-114, Springer-Verlag, Germany.

Held, M., "Chapter 8: Generating the Tool Path," On the Computational Geometry of Pocket Machining, 1991, pp. 115-126, Springer-Verlag, Germany.

Held, M., "Chapter 9: Constructing the Mesh," On the Computational Geometry of Pocket Machining, 1991, pp. 127-137, Springer-Verlag, Germany.

Held, M., "Chapter 10: Generating the Tool Path," On the Computational Geometry of Pocket Machining, 1991, pp. 139-146, Springer-Verlag, Germany.

Held, M., "Appendix A, Bibliography," On the Computational Geometry of Pocket Machining, 1991, pp. 147-180, Springer-Verlag, Germany.

Ibaraki, et al., "Tool Path Planning Using Trochoid Cycles for Hardened Steel in Die and Mold Manufacturing (1st Report), Tool Path Generation for Trochoid Cycles Based on Voronoi Diagram," Advances in Agile Manufacturing—ICAM 2003, 2003, pp. 435-442, China Machine Press.

Lambregts, et al., " An efficient automatic tool path generator for 2½ D free-form pockets," Computers in Industry, Aug. 1996, pp. 151-157, vol. 29, No. 3.

Persson, H., "NC machining of arbitrarily shaped pockets," Compter-Aided Design, May 1978, pp. 169-174, vol. 10, No. 3.

Salman, et al., "Voronoi diagram-based tool path compensations for removing uncut material in 2½ D pocket machining," Computer-Aided Design, Mar. 2006, pp. 194-209, vol. 38, No. 3.

Tsai, et al., "Operation Planning Based on Cutting Process Models," Annals of the CIRP, 1991, pp. 95-98, vol. 40, No. 1.

Vona, et al., "Voronoi toolpaths for PCB mechanical etch: Simple and intuitive algortihms with the 3D GPU," Proceedings of the 2005 IEEE International Conference on Volume, Apr. 2005, 8 pages.

Yamaji, et al., "Tool Path Planning Using Trochoid Cycles for Hardened Steel in Die and Mold Manufacturing (2nd Report), Tool Path Planning to Avoid an Excessive Tool Load," Advances in Agile Manufacturing—ICAM 2003, pp. 443-450, China Machine Press.

Yao, Z., "A Novel Cutter Path Planning Approach to High Speed Machining," Computer-Aided Design & Applications, 2006, pp. 241-248, vol. 3, Nos. 1-4.

"Adaptive Clearing: The missing strategy for roughing," <www.freesteel.co.uk>, 2 pages (May 7, 2006).

Kramer, Thomas R., "Pocket Milling with Tool Engagement Detection," cover page and pp. 1-16 (Apr. 4, 1991).

Stori, et al., "Constant Engagement Tool Path Generation for Convex Geometries," J. Mfg. Systems, 19:3; ABI/INFORM Global (2000).

Wang, et al., "A Metric-Based Approach to 2D Tool-Patah Optimization for High-Speed Machining," 9 pages, (2001).

* cited by examiner

50%

HIGH PERFORMANCE MILLING

CROSS-REFERENCES TO RELATED APPLICATIONS

This application claims the benefit of U.S. Provisional Application Ser. No. 61/103,515, filed on Oct. 7, 2008, entitled "HIGH PERFORMANCE MILLING." This application also claims the benefit of U.S. Provisional Application Ser. No. 61/103,869, filed on Oct. 8, 2008, entitled "HIGH PERFORMANCE MILLING," which is hereby incorporated herein in its entirety by reference.

BACKGROUND

Numerically controlled (NC) milling involves various techniques for removing material ("milling" or "cutting") from a workpiece to create an object of a particular shape and with defined dimensions. Because of the stresses imposed on parts (e.g., motors, gears, bits/drills, etc.) of a milling machine (also known as a machine tool) during the milling process, various techniques exist to generate toolpaths. A toolpath is a programmed path that a tool takes when milling a workpiece. A toolpath can comprise one or more "cuts." By varying toolpaths, stresses on parts of milling tools can be reduced.

The parallel-offset algorithm is a commonly employed milling toolpath algorithm. Various Computer Aided Manufacturing (CAM) systems that collectively generate many toolpaths may use different names for this algorithm, as well as different mathematics, but the fundamental algorithm is common. When a user uses a CAM system that employs this algorithm, the user can define an area to be machined (e.g., milled) by selecting geometry from the graphics display of a computer via a user interface provided by the CAM system. The user may also define other machining parameters, such as the diameter of the cutting tool, the spindle speed, the feedrate, the axial depth of cut (ADOC), and the radial depth of cut (RDOC). The algorithm can offset this geometry (inwardly, in the case of a pocket) by the radius of the cutting tool in use plus any stock (e.g., material that is cut or milled) to be left for finish milling or other purpose. This offset is further and repeatedly offset by the RDOC of the toolpath (which can be less than, equal to, or greater than the radius of the cutting tool) until the offsets collapse on themselves and no further offsets are needed. Any self-intersections of an offset are trimmed to produce one or more contiguous loops per offset, as illustrated in FIG. 1. A workpiece 100 is comprised of material 101. The material has a boundary geometry 102 that remains after a cutting tool traverses one or more paths or cuts to remove material. FIG. 1 illustrates several cuts of a toolpath, such as cut 104. Each cut indicates a path (or pass) that a cutting tool traverses in the toolpath. For example, the center line (or "offset") of each cut is illustrated.

The offsets generated in these steps form the path that the center of the cutting tool will follow when milling the workpiece. Typically, the innermost (smallest) offset in a local subarea of the toolpath is traversed first, followed by the next innermost, etc., until all of the offsets have been traversed. This can require "connecting moves" (or simply, "connections") to be inserted between each pair of adjacent offsets. The location and shape of these connections can vary depending on the CAM system in use, but are generally straight-line connections between points somewhere along and perpendicular to parallel segments of the adjacent offsets, and sometimes between local vertices of the adjacent offsets, as illustrated in FIG. 2. The workpiece is illustrated with offset connectors 202, 204, and 206.

This basic algorithm has several advantages: the tool can generally be kept moving in a single direction; the overall toolpath length is relatively short; repositioning moves within the toolpath are usually not excessive; and the toolpath is relatively easy to calculate. The simplicity of calculation is arguably the main reason that this algorithm is so commonly used by producers of CAM systems.

The parallel-offset algorithm is generally unable to maintain a consistent load on the cutting tool. The offsetting process ensures that a user-specified (e.g., programmed) RDOC parameter is not in effect throughout the toolpath. Because the actual RDOC varies, the material removal rate (MRR) also varies, and thereby causes the machining load to vary. The offsetting method generally maintains the actual, instantaneous RDOC (e.g., at any given time) at the programmed RDOC only in some areas of the toolpath. In a typical 2-axis toolpath, the ADOC, the spindle speed, and the feedrate remain substantially constant at the user-specified (programmed) values over a significant portion of the toolpath. In at least four disparate portions of a toolpath, however, the actual RDOC does not remain at the programmed value. Since the feedrate, the ADOC, and the RDOC combine to define the MRR of a toolpath, the varying RDOC dictates that the MRR does not remain constant.

When the tool first enters the material at the beginning of a toolpath, or when it enters a new area to be machined in the same toolpath, a parallel-offset toolpath typically fully engages the cutting tool. If the area to be machined is closed (e.g., if the shape necessitates that the tool enters the material from the top) a plunging action of some sort is made. This can be done by plunging the tool into a pre-drilled hole; plunging the tool along its axis (typically the Z-axis) directly into the material; ramping the tool into the material (e.g., plunging in the Z-axis while simultaneously feeding in the X- and/or Y-axis at some descending angle); or by helically interpolating into the material (e.g., by moving in a circular motion in the X- and Y-axes while simultaneously feeding down in the Z-axis). In all but the first of these cases, the tool is generally fully engaged in the material during the plunge move regardless of the programmed RDOC. In all cases, at least the first move after the tool reaches the programmed ADOC fully engages the tool with an actual RDOC of 100% of the diameter of the cutting tool regardless of the programmed RDOC, as illustrated in FIG. 3, in which the programmed RDOC is 50% of the diameter of the cutting tool. The workpiece is illustrated with a wall (or boundary) 302, material to be removed 304, toolpath segment 306, and tool footprint/circumference 308. If the area to be machined is open (e.g., if the tool can position to the ADOC outside of the material before feeding into the material from the side) the actual RDOC will be 100% in at least the first move into the material, regardless of the programmed RDOC, as illustrated in FIG. 4. A cutting tool having footprint/circumference 404 has traversed a toolpath segment 402 and will continue cutting via toolpath segments 406 and 408.

When the tool completes a traversal of an offset, it connects to the next offset. The common connection method for a parallel-offset toolpath is a straight line between the offsets. This generally causes the actual RDOC to increase over the programmed RDOC value. In most cases, such as the one illustrated in FIG. 5, this causes the machine to stop feeding in one direction and begin feeding in another, and thereby requires the machine to come to a complete stop. The deceleration time in stopping the feed in one axis and the acceleration time in beginning the feed in the other axis effectively reduces the programmed feedrate during that process, adding time to the machining cycle. Further, the deceleration occurs when the actual RDOC is decreasing at the completion of the traversal of the offset. This decrease in the RDOC begins when the leading edge of the cutting tool reaches the vertex of the dynamically evolving material boundary that was established at the beginning of the traversal of the offset. To maintain the MRR established by the machining parameters, the feedrate should be increasing as the actual RDOC is decreasing. In contrast, this toolpath algorithm requires the machine to decrease the feedrate in order to negotiate the sharp corner, which further adds to machining time. Further still, the acceleration in the new direction occurs as the actual RDOC is increasing up to and beyond the programmed RDOC. To maintain the established MRR, the feedrate should actually be decreasing once the programmed RDOC is exceeded. This machining dynamic, which is forced by the parallel-offset algorithm, places increased machining loads on the machine tool and the cutting tool (e.g., bit), and is detrimental to both.

As a cutting tool moves through material of a workpiece, the material boundary evolves. After an offset has been fully traversed, the workpiece has a new material boundary. This boundary, which is equivalent to offsetting the just-traversed offset by the radius of the cutting tool, and rounding any sharp corners with a radius equal to the tool radius (see FIG. 6), is in place when the next offset is traversed. During the traversal of this next offset, any time the leading edge of the cutting tool reaches the tangency point of one of the corner-rounds of the in-process material boundary, the actual RDOC begins to increase. Because feedrates and spindle speeds cannot dynamically update along with the dynamically increasing radial depth of cut, the MRR increases in these very common situations. The amount of this increased MRR and its duration depend on the programmed RDOC and the shape of the area being machined. The amount of increase and its duration are greater when the entry/exit angle of a directional change is more acute (see FIG. 7) and when the tool enters a new area to be machined with the same toolpath. For example, this can occur when the tool begins machining an innermost offset in a different, local subarea of the overall area being machined.

Yet another situation that causes an increase in the MRR in the parallel-offset—or any other—toolpath algorithm is when the tool transitions from milling in a linear fashion to milling in a circular fashion. Assuming a climb milling direction (e.g., tool to the left of the material with a clockwise spindle rotation), the actual RDOC increases whenever the tool traverses a counter-clockwise turn, even if the spacing between cuts remains constant. FIG. 8 illustrates that the actual RDOC when cutting in a straight line is equal to the programmed RDOC (e.g., 50%). FIG. 9 illustrates that the actual RDOC when cutting a concave arc (e.g., 62%) is greater than the programmed RDOC (e.g., 50%). This increase is a function of the diameter of the cutting tool, the programmed RDOC, and the toolpath radius being traversed.

There are many other toolpath algorithms offered in CAM systems. Many are designed to mitigate the negative characteristics of the basic parallel-offset toolpath algorithm. However, these algorithms tend to be case-specific, and are therefore not generalized solutions. Further, many of these algorithms are designed to address a specific negative characteristic of the basic parallel-offset algorithm by focusing on a symptom of the problem rather than treating the problem as a whole. In taking this approach, these algorithms introduce new problems that do not exist in the basic algorithm. The result is that these new algorithms do not significantly increase milling speed or improve machining dynamics. In many cases, they achieve the opposite effect.

DETAILED DESCRIPTION

Figure 1:
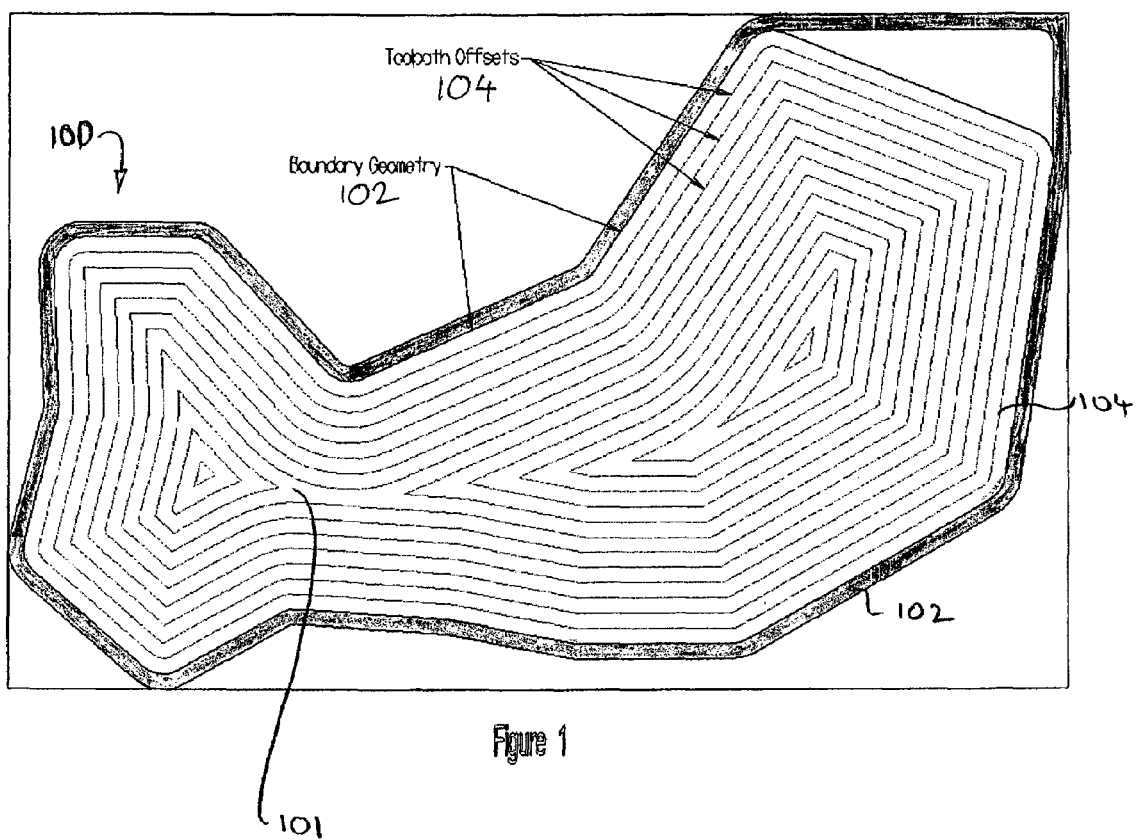
FIG. 1 is a plan-view diagram illustrating a workpiece and a toolpath with multiple cuts with two local regions.
Figure 2:
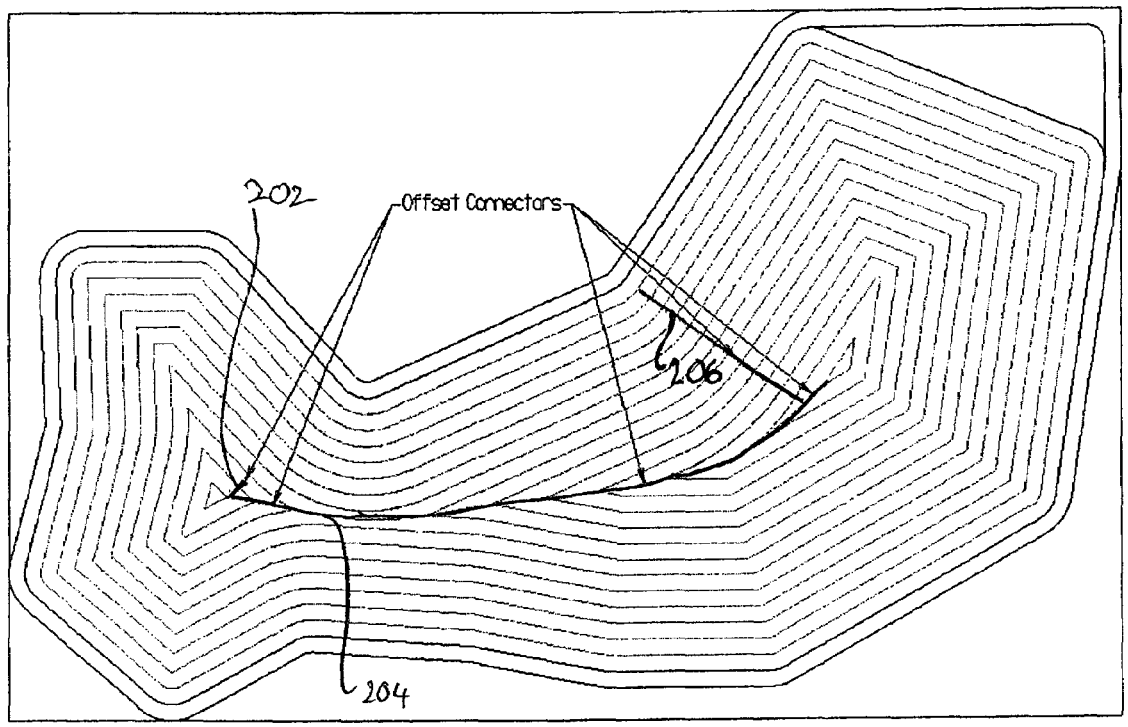
FIG. 2 is a plan-view diagram illustrating the workpiece of FIG. 1 with offset connectors between segments and vertices of the two local regions.
Figure 3:
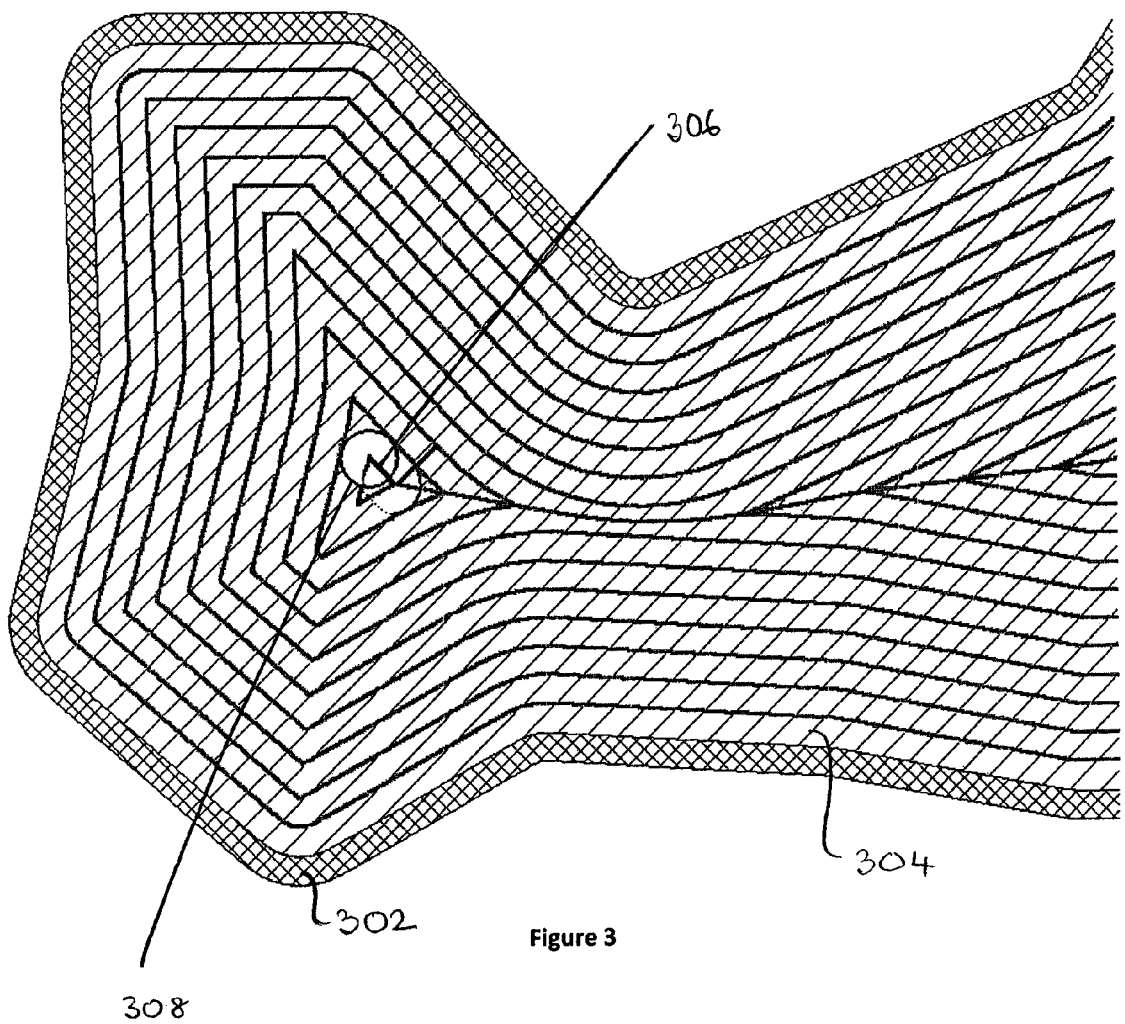
FIG. 3 is a plan-view diagram illustrating a workpiece in which a radial depth of cut is selected at 50% of the diameter of a cutting tool, yet the first cut is at an actual RDOC of 100%.
Figure 4:
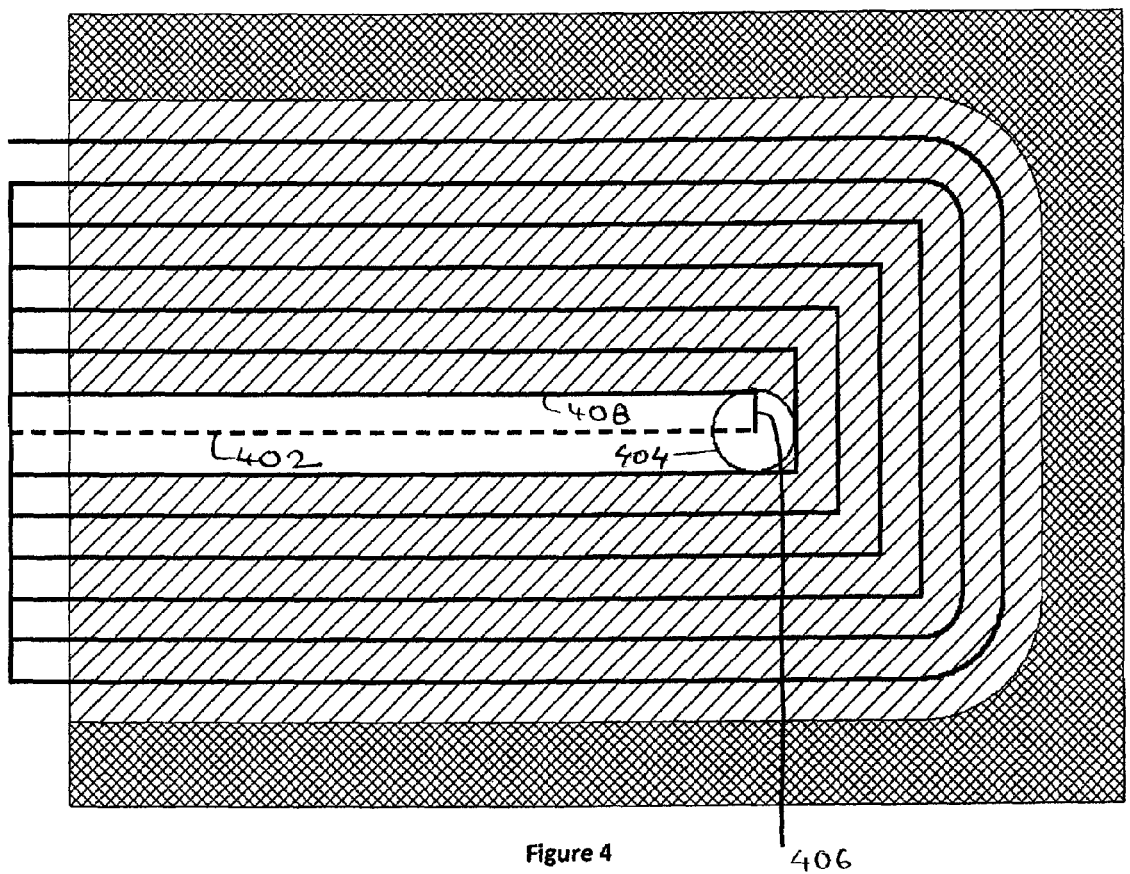
FIG. 4 is a plan-view diagram illustrating a radial depth of cut of 100% of the diameter of a cutting tool in the first cut upon entering the material from the side, even though the programmed RDOC is 50% of the diameter of the cutting tool.
Figure 5:
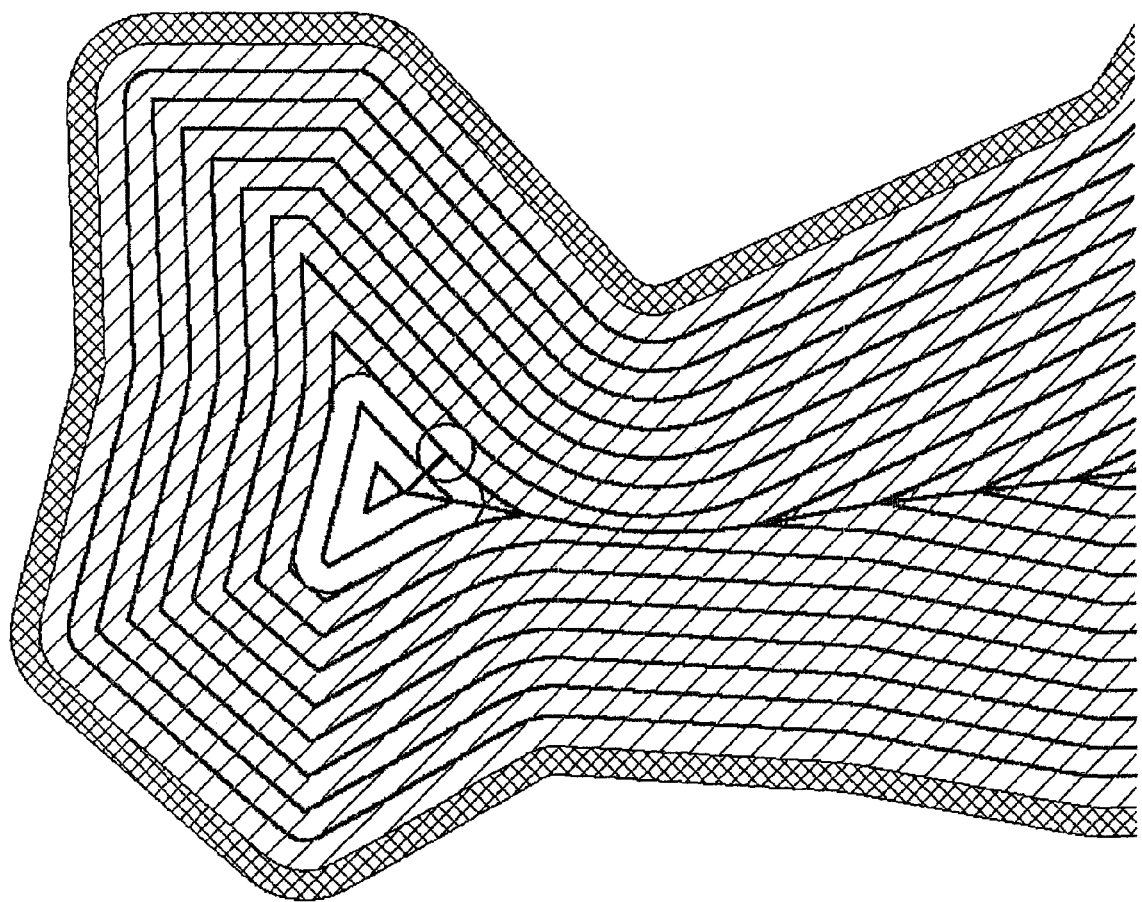
FIG. 5 is a plan-view diagram illustrating a workpiece and a toolpath that causes the milling machine to stop feeding a cutting tool in one direction and begin feeding it in another direction.
Figure 6:
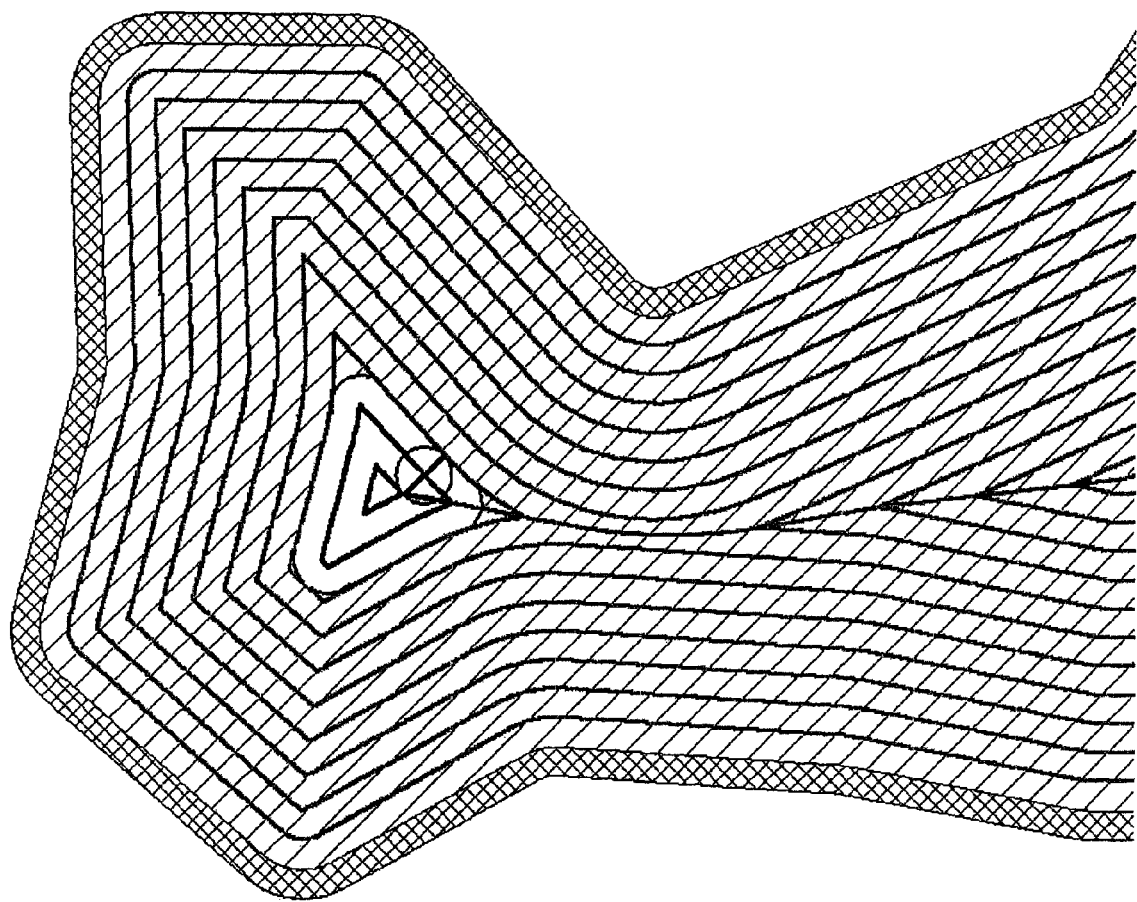
FIG. 6 is a plan-view diagram illustrating a material boundary that has evolved from the tool traversing an offset in a workpiece that is being milled.
Figure 7:
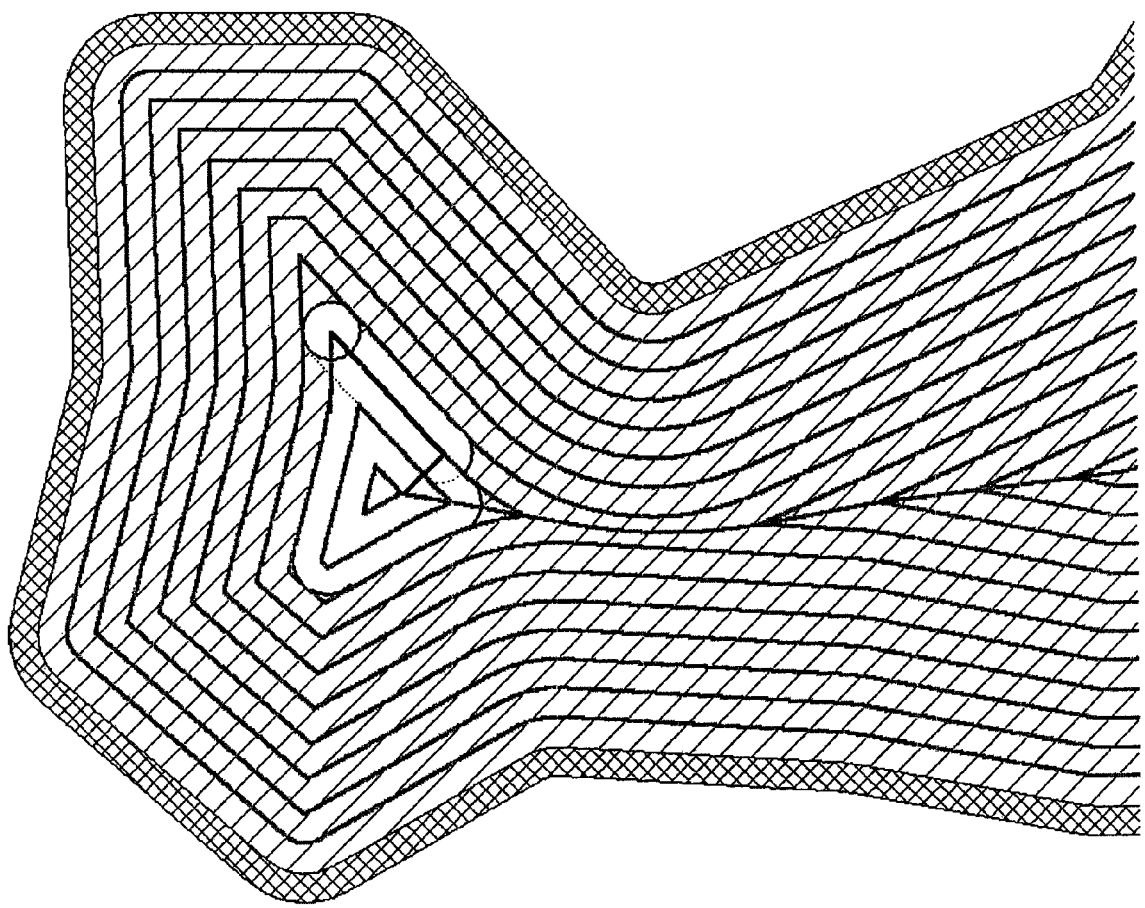
FIG. 7 is a plan-view diagram illustrating the increase in actual RDOC from feeding a cutting tool past a tangency point.

A high performance milling technology ("the described technology") is described. The described technology provides methods and apparatuses for milling areas of a part so that more aggressive machining parameters can be used in the toolpath, thereby resulting in reduced machining time and load. When milling along a path of constant curvature with a constant feed rate, constant ADOC, and constant RDOC, a constant MRR can be established. In a typical 2-axis milling application, the cutting feed rate can be controlled by a parameter that is set or approved by the numerically controlled machine ("NC") programmer, and is constant throughout the toolpath. The ADOC is the distance between the top of the workpiece in the local area to be machined and the floor of the area that will result from running the toolpath on the part. The ADOC can also be controlled by a parameter that is set or approved by the NC programmer; and because the top of the workpiece in the local area to be machined and the floor that results from running the toolpath are typically parallel to each other, this value can remain constant throughout the toolpath. Likewise, the RDOC is controlled by a parameter that is set or approved by the NC programmer. Unlike the other two parameters, however, the actual, instantaneous value of this parameter can differ from the programmed value in various areas of a toolpath. Because a cutting tool can visit these areas of a toolpath numerous times in a single toolpath, the MRR can vary throughout the toolpath. This can cause an NC programmer to use machining parameters that are sufficiently conservative to enable the cutting tool to survive instances of greatest MRR.

The instantaneous RDOC generally varies in four areas of a toolpath. The described technology comprises methods that enable toolpaths to be generated that are free from the instances of increased MRR. The described technology generates Transition Areas that enable tools to negotiate areas that would otherwise result in increased MRR.

There may be two possible methods of entering an area to be machined: from above, where the cutting tool is required to plunge, or descend, into the material; and from the side, where the cutting tool can position to the required or desired cut depth while outside the material before entering the material. The specific geometry or local area of the part being machined will determine whether one or both of these entry methods are possible.

Although some embodiments are described below, the described technology can be implemented using other embodiments.

First Embodiment

When entering the material from above, the described technology employs a special form of a ramp entry. The tool descends in the Z-axis while simultaneously cutting in the X- and Y-axes. The angle of descent can be controlled by a parameter. Preferably, the ramp-angle parameter is expressed in degrees and is within the range of greater than zero (no plunge in the Z-axis) and less than ninety (straight plunge in the Z-axis). Preferably, the direction of the X-Y motion is determined by the system, as a function of the shape of the area being machined.

Figure 10:
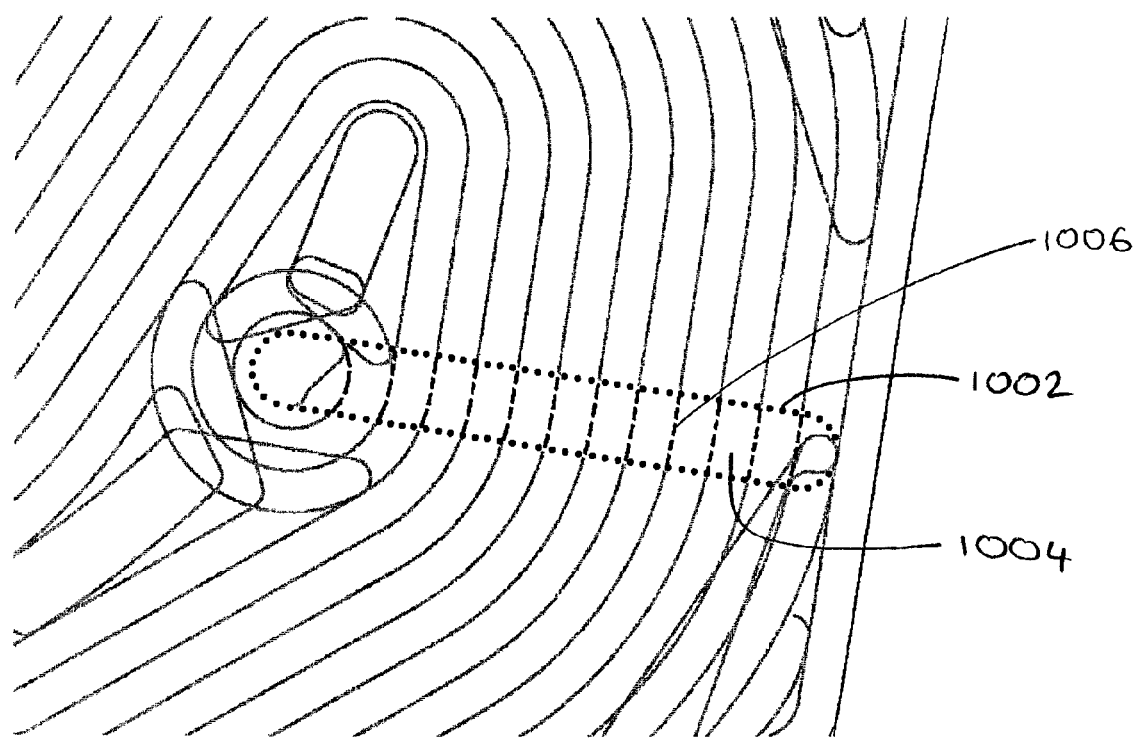
FIG. 10 is a plan-view diagram illustrating a toolpath motion that creates the transition area.

As the ramp reverses direction, it can do so with a 180-degree circular arc of a radius of less than or equal to the diameter of the flat portion of the bottom of the tool. When the round-ended ramp reaches the cut depth (programmed ADOC for the toolpath), it traverses the path of the ramp once more with the Z-axis fixed at the ADOC to ensure that a flat floor is produced in the ramp area. The result is a machined transition area with straight, parallel sides, spaced by a value that is less than or equal to two times the value of the diameter of the flat portion of the bottom of the cutting tool plus the diameter of the cutting tool, and is closed at each end with an arc of full radius that is tangent continuous with both straight sides. FIG. 10 illustrates a toolpath motion 1002 that creates the transition area 1004. The actual in-process material boundary that results from the motion illustrated in FIG. 10 is offset from the tool motion by the radius of the cutting tool.

The center of one of the end-radii can be coincident with the center of the largest local subarea of the area to be machined. Another end-radius can be tangent to the outermost offset in the local subarea of the area to be machined, as also illustrated in FIG. 10. The transition area may then intersect one or more cuts of the toolpath in the local subarea. FIG. 10 further illustrates the cuts of the toolpath intersecting the transition area. The described technology may remove the intersecting portions illustrated as dashed lines, such as dashed line 1006.

The center point of the local subarea being machined can be determined in a number of ways, including the use of the medial axis transform (MAT) of the selected geometry. A suitable location along the MAT for the center point of the local subarea may be a local branch point of the MAT or any other nearby point of the MAT with a locally maximal or near locally maximal radius function. The center point may also be determined from the offsets of the boundary geometry. The innermost offset of a local subarea of an area to be machined can reduce to a few elements (e.g., three in some embodiments) regardless of the number of elements in the selected boundary geometry. The center point of the largest circle that can be inscribed within the innermost offset and be tangent to at least two (and preferably three in some embodiments) of the offset elements is the center of a local subarea to be machined.

Figure 11:
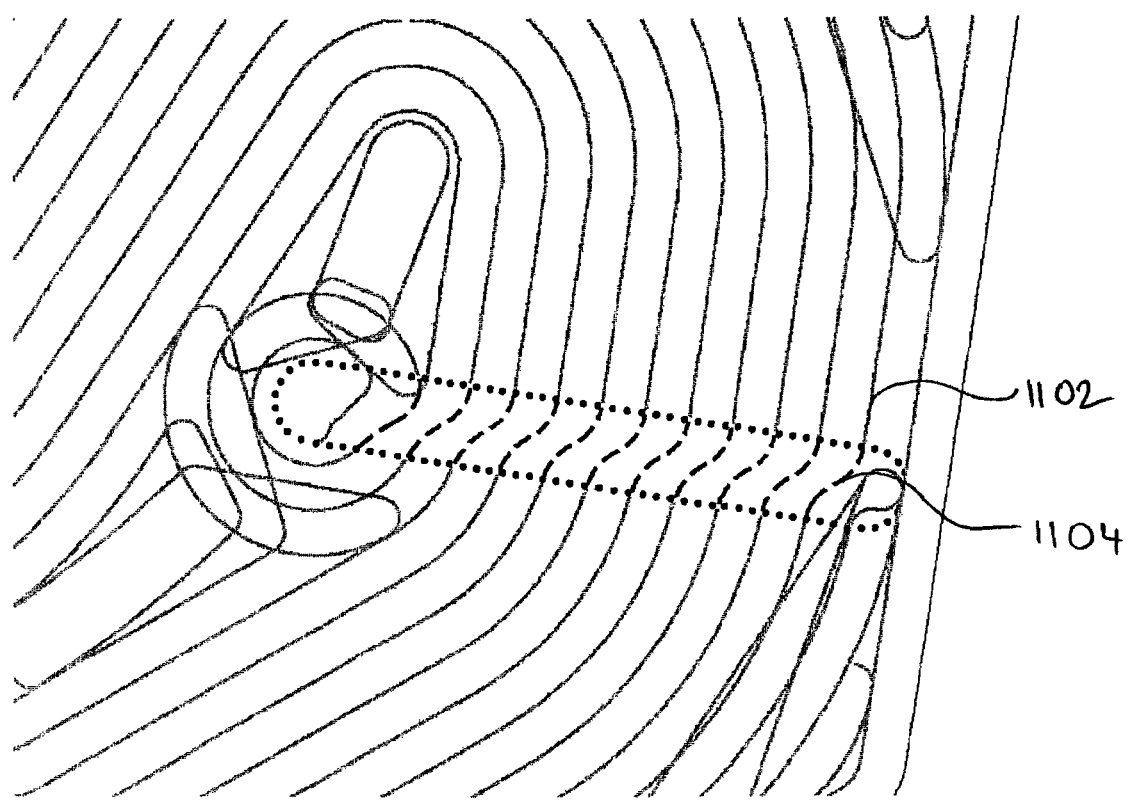
FIG. 11 is a plan-view diagram illustrating trimming offsets that comprise the toolpath from within a Transition Area.

FIG. 11 illustrates that trimming the offsets that comprise the toolpath from within this Transition Area creates a set of equally spaced offsets that all begin at the same side of the Transition Area and all end at the other side of the Transition Area depending on the direction of cut. The illustration includes trimmed cuts 1102. When the cutting tool begins one of these cuts, it can do so without exceeding the programmed RDOC. When the cutting tool completes one of these cuts, it can do so without the need to slow down or come to a stop. The cutting tool is able to transition from the end of one cut to the beginning of the next while completely disengaged from the material. This transition can follow an "S" curve of two arcs, which provides for tangent continuous motion illustrated as dashed lines, such as dashed line 1104. Other types of transition curves are also possible.

This embodiment addresses two of the four areas of a toolpath where the RDOC, and therefore the MRR, increases during a toolpath: 1) upon initial entry into the material, either at the beginning of the tool path or when entering a new area to be machined with the same tool path; and 2) when stepping over from one cut to another. An easy way of creating this Transition Area is with a straight ramp that connects the center point to the boundary. However, ramps that intersect the offset boundaries and are sufficiently wide to maneuver the tool from one end of a cut to the start of another cut can also be employed. Instead of a ramp, various techniques can use a pre-drilled hole or employ a helical entry and the second embodiment described herein to cut a slot to the boundary.

Methods of entry into material that plunge from above generally fully engage the cutting tool with the material. In the case of a ramp entry, as used in this embodiment, as well as a helical entry, the Z-axis is constantly feeding downward. This can result in an actual, instantaneous ADOC that is constantly increasing during at least a portion of the entry move. Since modern machine tools generally do not support dynamically changing feedrates during any single block of code, the effective MRR may not be constant during such moves. This can be equally true for the described technology as it is for prior toolpath algorithms, though the smooth motion of the described technology provides a machining advantage over prior methods. The in-process material boundary that results from the entry motion of the described technology facilitates connecting from the end of one cut to the beginning of the next while the cutting tool is disengaged from the material.

Second Embodiment

Figure 12:
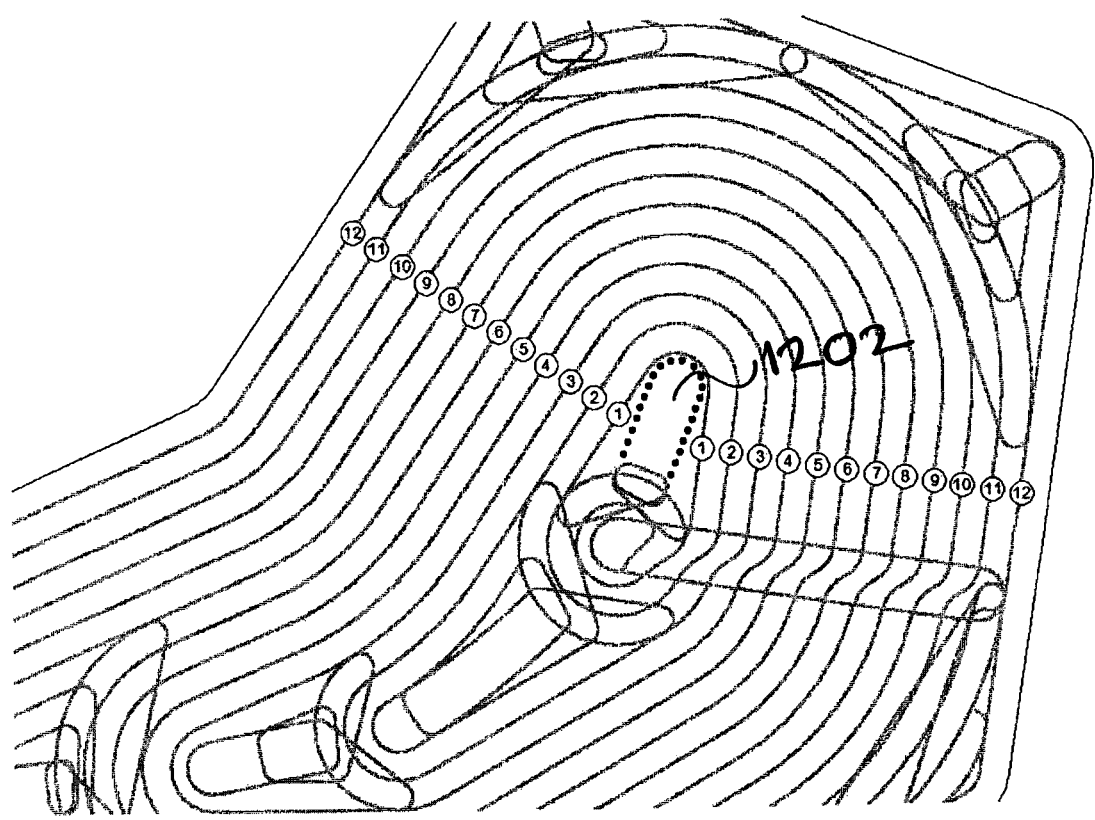
FIG. 12 is a plan-view diagram illustrating a substantially equal number of cuts in either side of a selected Transition Area location.

Whenever the actual, instantaneous RDOC exceeds the programmed RDOC, the ADOC and/or the programmed feedrate can automatically adjust to maintain the actual, instantaneous MRR at or below the constant curvature value. When a new area of the material is to be entered from the side, the described technology creates a new Transition Area. The location of such new Transition Areas is such that a substantially equal number of cuts may exist on either side of the location, as illustrated in FIG. 12. The path of such new transition areas follows the MAT in the local subarea 1202 (area surrounded by dotted line). It does so by feeding the tool along an offset of the MAT (to the right of the MAT, if climb milling; to the left of the MAT, if conventional milling) that is less than or equal to the radius of the flat portion of the bottom of the cutting tool. At the end of the new Transition Area, the tool reverses direction with a full radius that is equal to the offset distance from the MAT, and returns along an equal offset of the MAT on the opposite side, as further illustrated in FIG. 12. In the described technology, the offsets from the MAT may be manipulated such that they contain no sharp, discontinuous directional changes, even if discontinuities in the MAT are present. For example, the offset distance can be decreased by a small amount sufficient to apply a curve smoothing technique so that the smoothed boundary is sufficiently narrow so that no uncut material remains. Other smoothing techniques can also be used.

The actual RDOC increases when milling into a new Transition Area as a function of the programmed RDOC. The maximum possible RDOC at any time, when expressed as a numerical value, may be equal to the diameter of the cutting tool in use. The maximum possible RDOC at any time, when expressed as a percentage of the diameter of the cutting tool in use, may be 100%. Because the percentage method of expressing the RDOC is applicable to cutting tools of any diameter, it is the preferred method of expression. Slot milling is defined as milling with a 100% RDOC. When the programmed RDOC is less than 100%, slot milling to create a new Transition Area increases the actual RDOC to 100%, which, if unmitigated, could cause an increase in the MRR. The percentage increase in the RDOC is greater for smaller programmed RDOCs and smaller for larger programmed RDOCs. In all cases, however, there is an increase in the RDOC, and therefore an increase in the MRR.

Figure 13:
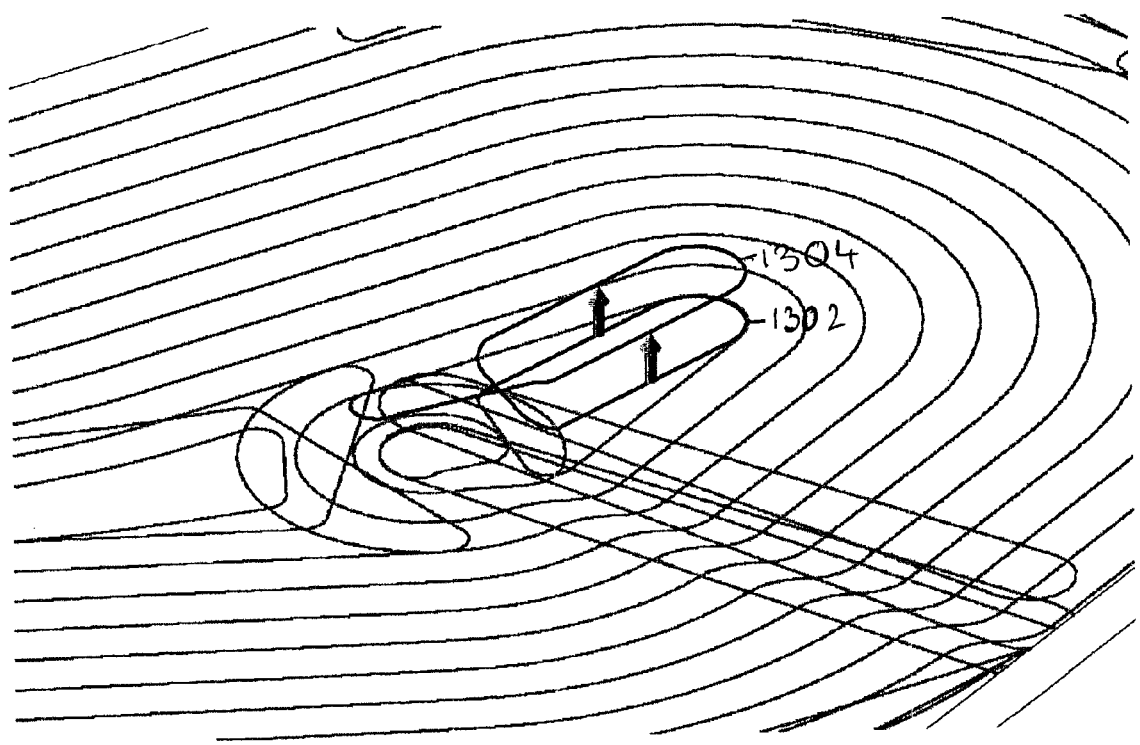
FIG. 13 is an angled-view diagram illustrating repeated slot milling to fully clear an area by automatically adding a second slot milling cut.

When the actual RDOC increases, the described technology can automatically add multiple ADOCs and/or reduce the programmed feed rate to keep the MRR at or below the programmed level. For example, a cutting tool programmed at a fixed ADOC, at a fixed feedrate, and a 50% RDOC, may see the actual RDOC, and therefore the MRR, double to 100% when it becomes fully engaged during slot milling. When this occurs, the described technology can first mill the slot at half the programmed ADOC, which keeps the MRR constant. This may require that the slot milling be repeated at the full programmed ADOC to fully clear the area, as illustrated in FIG. 13 by segments 1302 and 1304. When specific cuts are identified in this description, no order is presumed. For example, one skilled in the art may elect to cut via segment 1304 before cutting via segment 1302.

Figure 14:
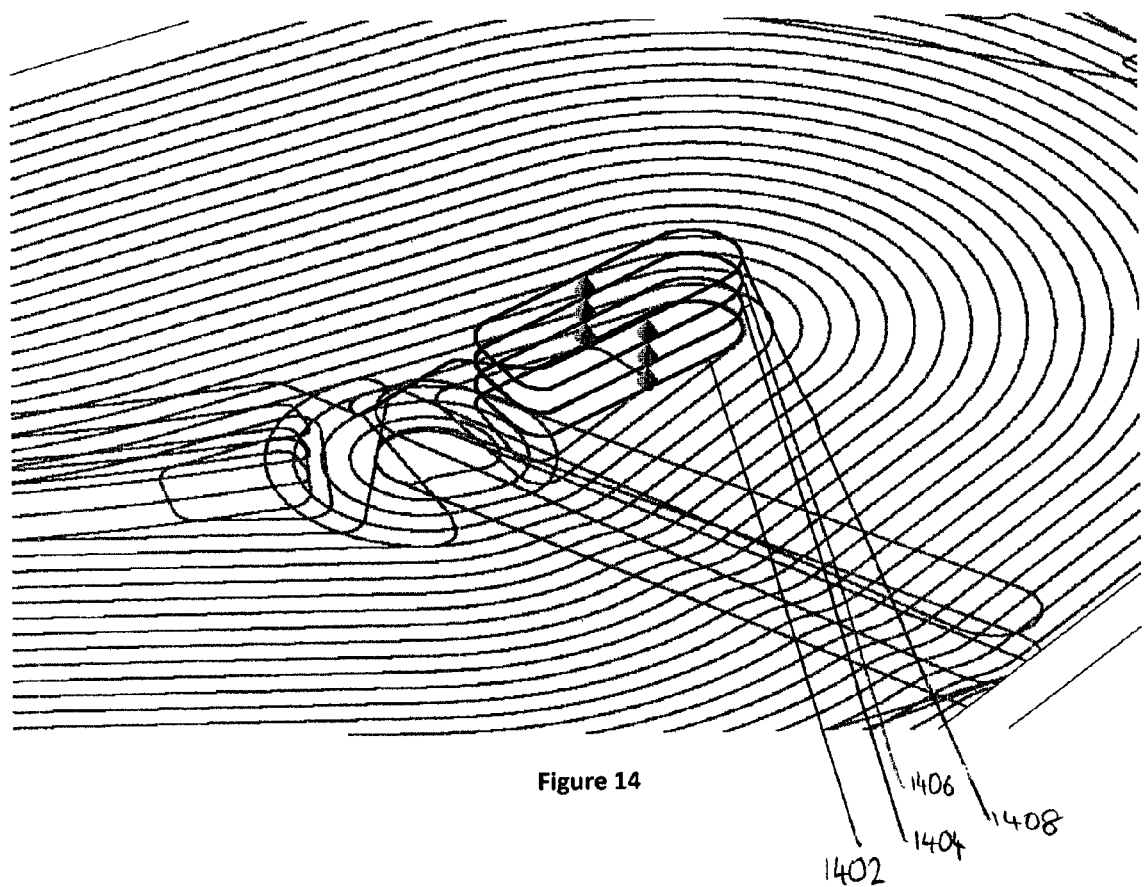
FIG. 14 is an angled-view diagram illustrating repeated slot milling to fully clear an area by automatically adding three slot milling cuts.
Figure 15:
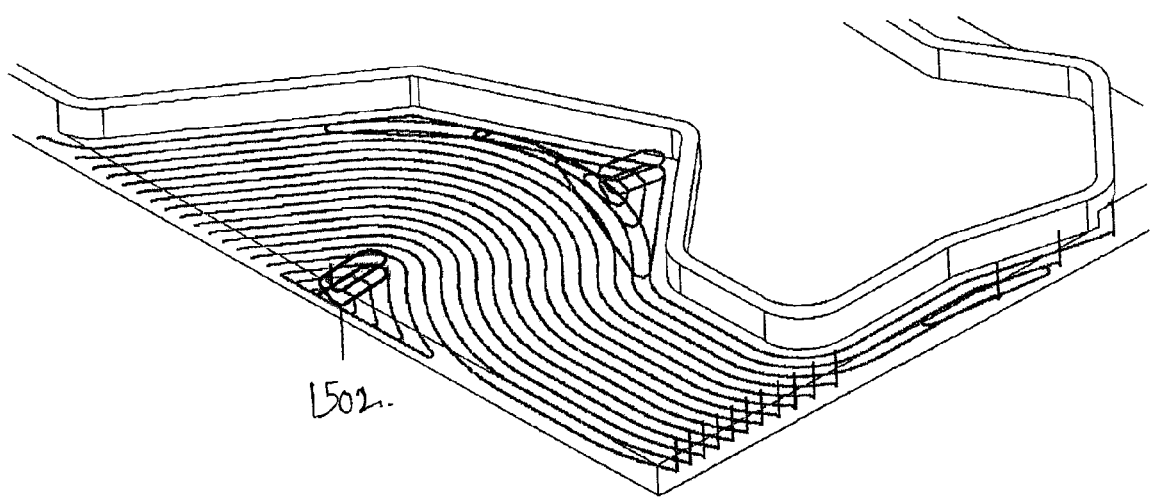
FIG. 15 is an angled-view diagram illustrating cuts made from a side of a workpiece.

In another example, a cutting tool programmed at a RDOC of 25% may experience a quadrupling of the RDOC to 100% during slot milling. The described technology may automatically add three slot milling cuts for a total of four, as illustrated in FIG. 14 as segments 1402, 1404, 1406, and 1408. One skilled in the art may elect to cut the segments in various orders, such as: 1408, 1406, 1404, and then 1402. The first of these cuts can be at 25% of the programmed ADOC; the second at 50% of the programmed ADOC; the third at 75% of the programmed ADOC; and the final cut at the full programmed ADOC. In this manner, the MRR is the same for each of the four cuts as it is for a constant-curvature cut at the full programmed ADOC at a 25% RDOC. Alternatively, adding just one additional cut at 50% of the programmed ADOC and reducing the programmed feed rate by 50% will also maintain the same MRR.

It may also be possible to maintain the MRR through feed rate adjustment alone. If a 75% programmed RDOC is used, for example, the actual RDOC increases only 25% during slot milling. Reducing the programmed feed rate by 25% will maintain the MRR with no additional cuts. The described technology is configured to receive such adjustments.

Thus, the described technology can (1) isolate slot-milling events within a toolpath and manipulate ADOCs during those events; (2) isolate slot-milling events within a toolpath and manipulate ADOCs in conjunction with feed rates during those events; and (3) generate slot-milling events in strategic locations throughout a toolpath and manipulate feed rates during those events during toolpath generation. The second embodiment establishes a Transition Area by slot milling the area, perhaps with varying ADOCs and/or feed rates. The Transition Areas could also be milled without slotting, such as by using a "trochoidal" path, curved path, or some other strategy that feeds the tool into the area with a smooth technique.

The Transition Areas address three of the four areas of a toolpath where the RDOC, and therefore the MRR, increase during a toolpath: 1) upon initial entry into the material, either at the beginning of the tool path or when entering a new area to be machined with the same tool path (e.g., when the material is entered from the side); 2) when stepping over from one cut to the next; and 3) when the current cut being traversed would otherwise extend beyond the turning point of the previous, substantially parallel cut.

Figure 16:
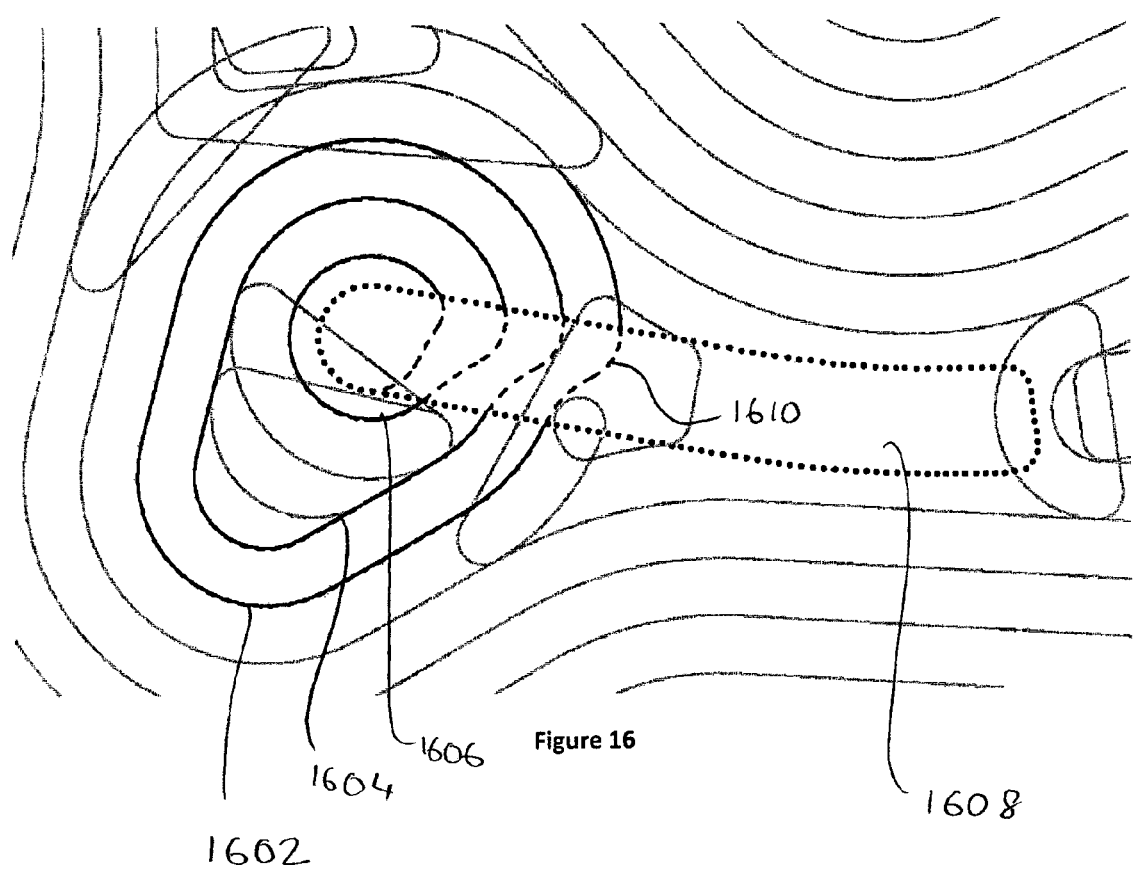
FIG. 16 is a plan-view diagram illustrating cuts intersecting Transition areas.
Figure 17:
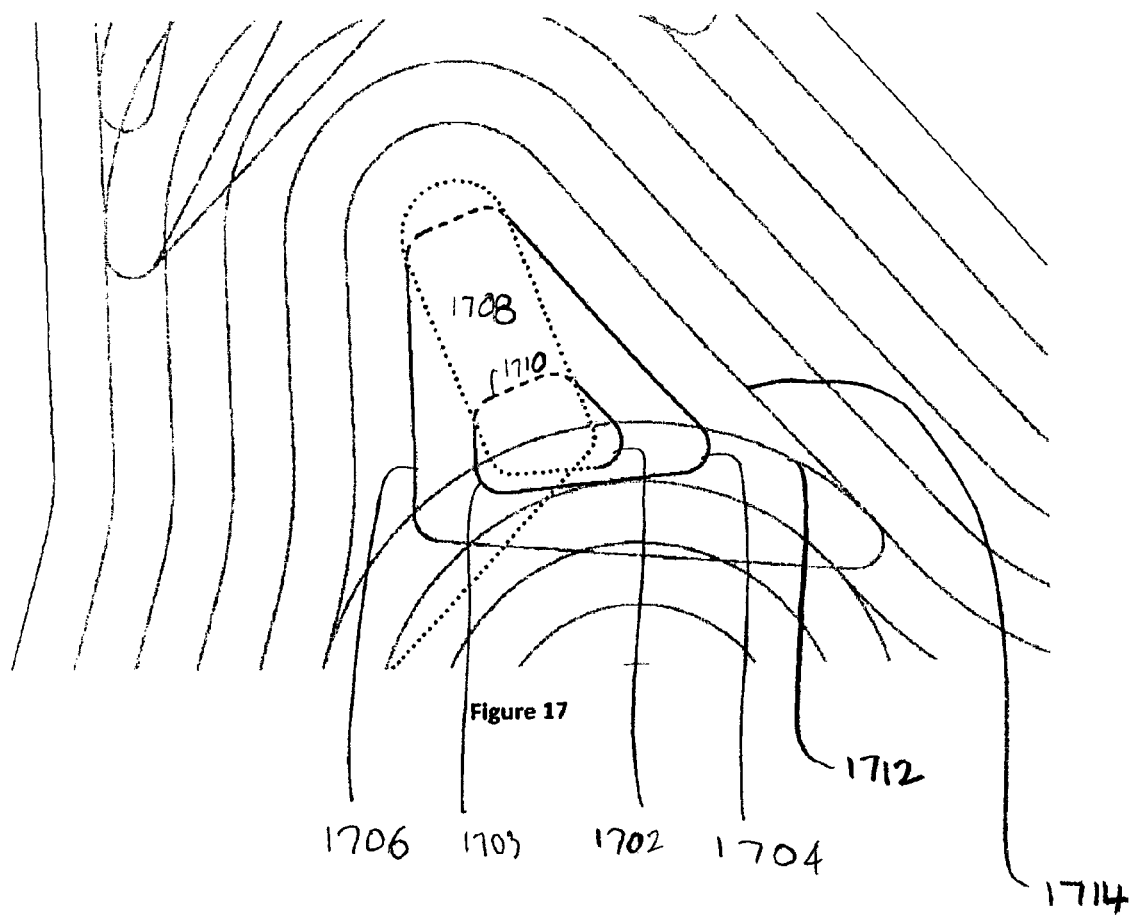
FIG. 17 is a plan-view diagram illustrating cuts interrupted by Transition areas.

This embodiment of the described technology can be used to mill a Transition Area that is different from the Transition Area of the first embodiment. The Transition Areas of the first embodiment may be substantially perpendicular to the toolpath offsets and typically do not follow segments of the MAT in the local subarea. Transition Areas of the second embodiment may follow one or more segments of the MAT in the local subarea. These Transition Areas can be employed when following the natural trajectory of a cut would otherwise lead to an uncontrollable increase in the actual RDOC. They extend to another center point of another local subarea of the area being machined. In some cases, this new center point is a point about which a new outward expansion of cuts may begin. In such cases, the Transition Area of the second embodiment can be used just as the Transition Areas of the first embodiment, to connect from the end of one cut to the beginning of the next cut. FIG. 16 illustrates cuts of a toolpath 1602, 1604, and 1606 of the described technology that are interrupted by a Transition Area 1608. (The cuts may be performed in the order 1606, 1604, and 1602.) Because many of the cuts that intersect the Transition Areas of the second embodiment may be substantially parallel to it, they connect through the Transition Area in a manner that is subtly different: the Transition Area is used to connect from a stopping point of one cut to the continuation of the same cut. The dashed portions (e.g., portion 1610) illustrate connections from one end of the cut to the beginning of the next, similar to the Transition Area of the first embodiment. FIG. 17 illustrates cuts 1702, 1703 1704, and 1706 that are interrupted by a Transition Area 1708 of the second embodiment. Connections 1710 connect from the interrupted end of a cut to the continuation of the same cut on the opposite side of the Transition Area. In various embodiments, inner cuts can be traversed before outer cuts. Without the Transition Area, a portion of the cut would take place under a high increase in the programmed RDOC, commonly a 100% RDOC, as is illustrated by the innermost dashed cut 1802 of a typical toolpath in FIG. 18.

Third Embodiment

The first and second embodiments may establish toolpath segments that are partially circular and of known radii at known, strategic locations within the area to be machined, as illustrated in FIGS. 10 through 14. The third embodiment may employ these toolpath segments of known radii at known, strategic locations within the area to be machined to also address the areas of a toolpath where the RDOC, and therefore the MRR, increase when the current cut being traversed extends beyond the turning point of the previous, substantially parallel cut.

Figure 8:
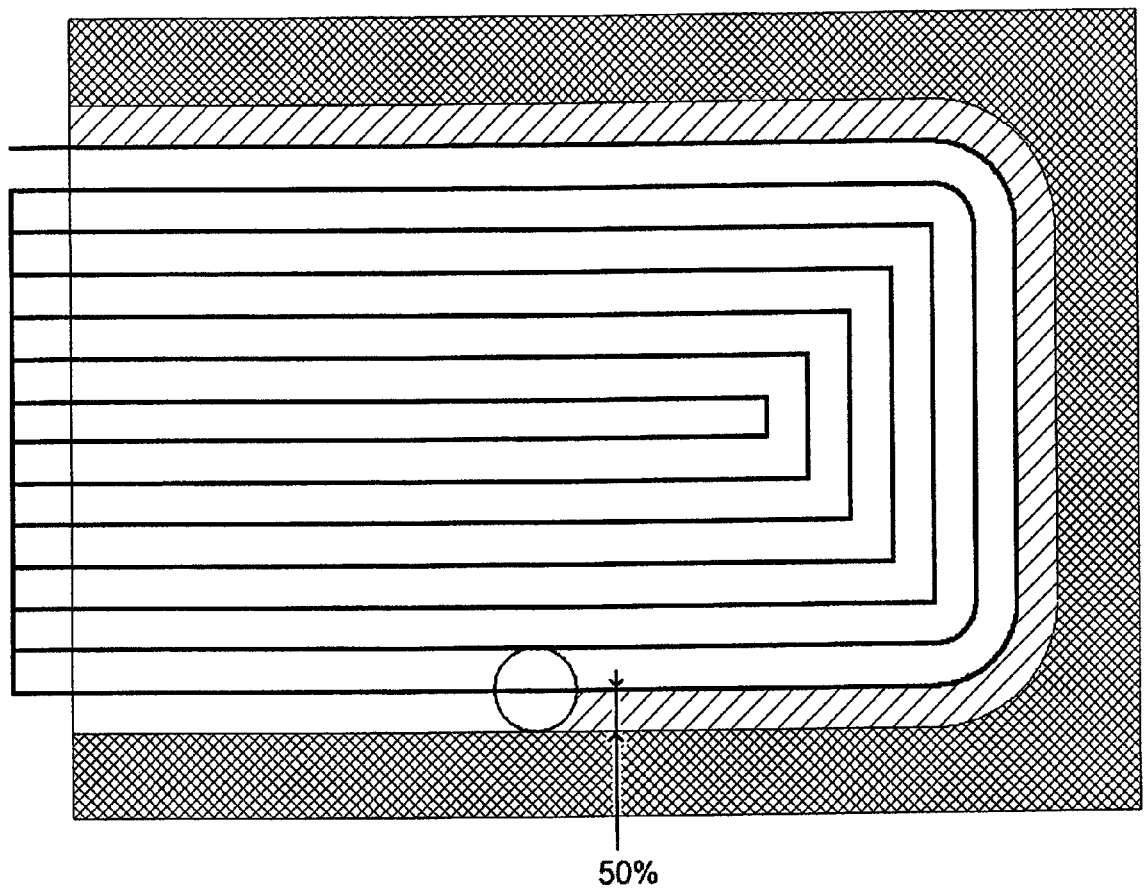
FIG. 8 is a plan-view diagram illustrating an example of an actual radial depth of cut being equal to the programmed radial depth of cut.
Figure 9:
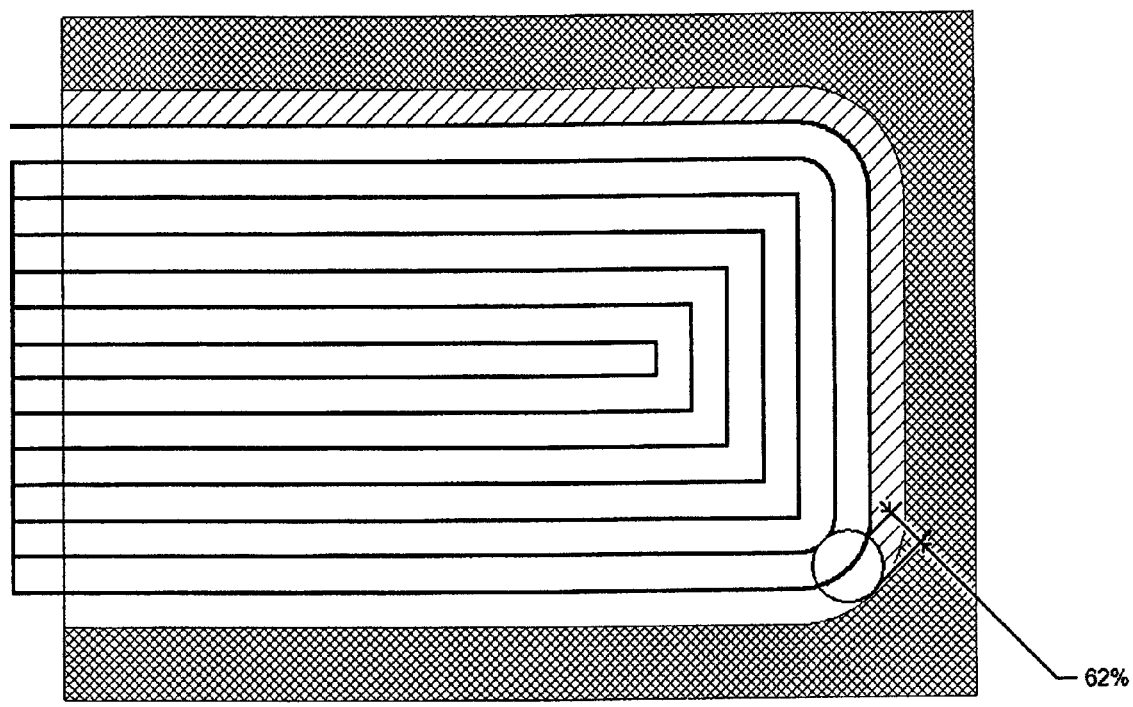
FIG. 9 is a plan-view diagram illustrating an example an actual radial depth of cut exceeding the programmed radial depth of cut just by traversing a counterclockwise arc, even though the spacing between cuts remains constant.

When milling along a path of constant curvature, whether or not that path is linear, with a constant feed rate, constant ADOC, and constant RDOC, a constant MRR can be established. When the curvature of the path changes, the actual RDOC, and therefore the MRR, changes. When the toolpath curvature increases in a counter-clockwise direction while climb milling, the actual RDOC, and therefore the MRR, increases, as illustrated in FIGS. 8 and 9. When the curvature decreases in a counter-clockwise direction, the actual RDOC decreases. When the toolpath curvature increases in a clockwise direction while conventional milling, the actual RDOC increases; when the curvature decreases in a clockwise direction, the actual RDOC decreases. A decreasing actual RDOC lessens the machining load, and is therefore typically not detrimental to the machining process. In various embodiments, the described technology may make no accommodations for events of decreasing RDOC.

The third embodiment of the described technology can create an inward offset of the boundary geometry and then can employ outward offsets in conjunction with the second embodiment of the technology to generate smooth passes in the final toolpath. An inward offset distance D is computed so that the boundary of a Transition Area created with the second embodiment of the technology covers a significant portion of the inward offset. The Transition Area may be placed over a portion of the offset that exhibits a sharp corner or high curvature to prevent the large increases in the RDOC that would occur in a toolpath without the Transition Area. For example, in FIG. 18, dashed line 1802 illustrates an inward offset of the boundary geometry. Toolpath segment 1804 is a boundary of the Transition Area that covers a portion of the offset 1802, including the sharp corner 1810.

The offset 1802 can then be offset outwards towards the boundary repeatedly to generate successive smooth passes beginning with segment 1806. The outward offset distances are computed as follows: Let D be the inward offset distance chosen above, and let S be the programmed RDOC. Find a unique positive integer k such that $kS<D<=(k+1)S$. The outward offset distances, then, are equal to $D-kS$, $D-(k-1)S$, $D-(k-2)S$, and so on. Thus, segment 1806 is an outward offset of segment 1802, at a distance $D-kS$.

Figure 18:
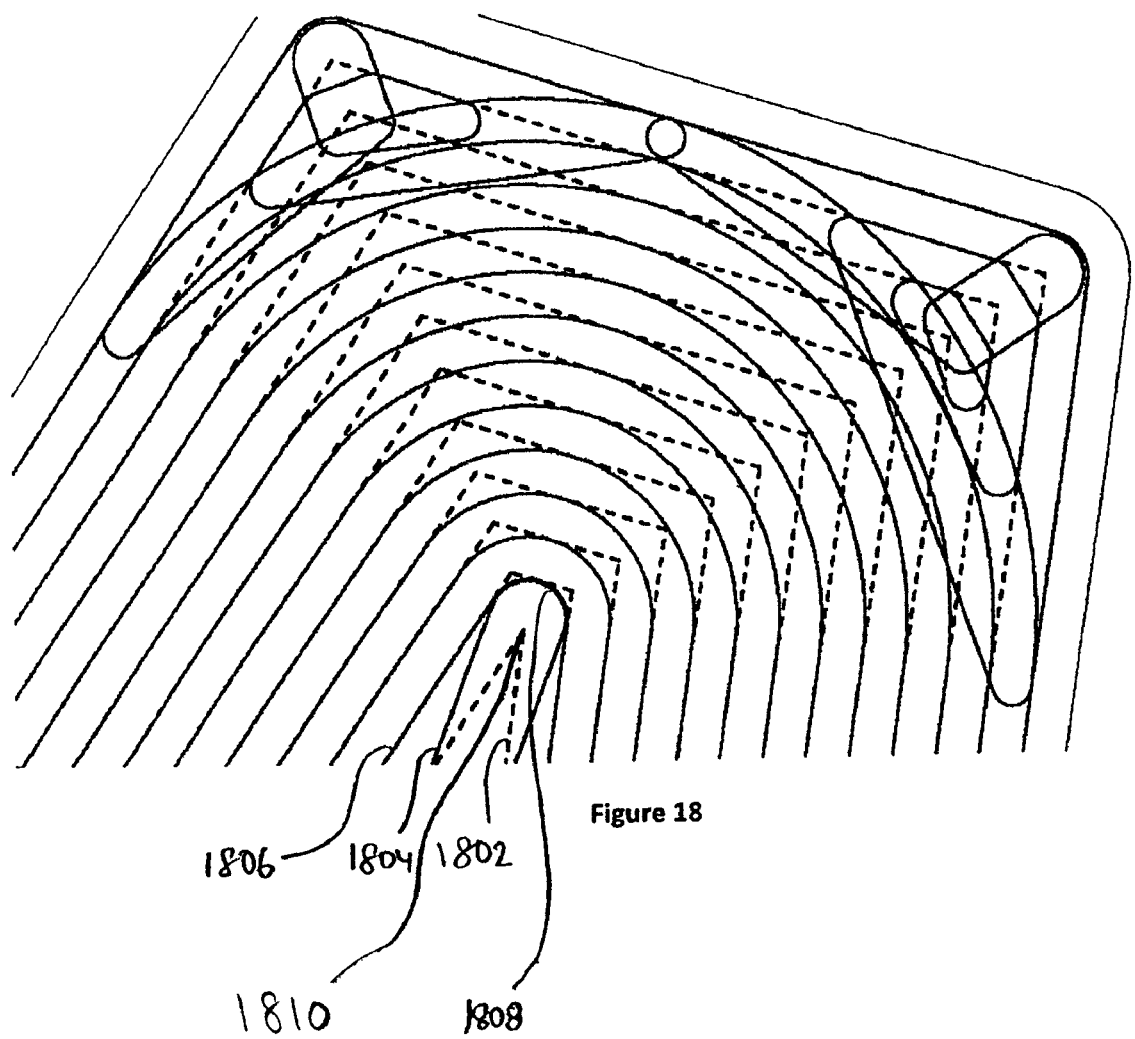
FIG. 18 is a plan-view diagram illustrating tangent-continuous chains.

After creating some number of outward offsets, the process stops. In FIG. 18, the last outward offset stops when it is coincident with the outermost cut of the area being machined, and then the second embodiment is used to cut the material remaining in the corners. However, it is possible to stop the offsetting at any time before reaching the boundary and then use the second embodiment to create another transition area. FIG. 17 illustrates an example where the offsetting stops at the offset labeled 1712, a Transition Area 1708 (bounded by dotted lines in the figure) is created, the area around the Transition Area is cut, and then the offsetting resumes with offset 1714. As an example, the toolpath can cut material employing the following toolpath segments: 1712, Transition Area 1708, 1702, 1703, 1704, 1706, and 1714.

Although the description above describes how to construct a smooth toolpath using offsets of an entire boundary, the same technique can apply to construct offsets of different subsets of the boundary using different values of the inward offset distance D for each subset, and then create outward offsets for each subset independently. These independent outward offsets can then be joined together if desired.

Implementing the third embodiment does not prevent the actual RDOC from increasing 1) when negotiating changes of direction (e.g., when the toolpath turns counter-clockwise when climb milling or clockwise when conventional milling) or 2) when the current cut being traversed extends beyond the turning point of the previous, substantially parallel cut. The increased actual RDOC may be limited to unambiguously known values, at unambiguously known locations, along unambiguously known paths of constant curvature. Thus, simple, dynamic reductions in the programmed feed rate can keep the MRR constant even though the actual RDOC has increased. Such feed rate adjustments are included as an aspect of the described technology.

Some prior algorithms depend on controlling the tool engagement angle. The described technology does not need to control the tool engagement angle. Rather, it can control the actual, instantaneous RDOC, which produces equal spacing between all cuts. Therefore, fewer cuts are required in areas of diminishing size than with other techniques thereby resulting in significantly shorter toolpath lengths. In addition, the described technology enables complete engagement of the tool in such areas, adjusting for the otherwise increased MMR by adding multiple, shallower ADOCs and/or reducing the feedrate to maintain the pre-established MRR.

The described technology generates significantly shorter toolpaths than other techniques for various shapes, such as "open" shapes (e.g., the core or male half of a mold shape), "closed" shapes (e.g., the cavity or female half of a mold), and in generalized pocketing.

Aspects of the described technology involve machines including or interoperating with computing devices. The computing devices on which the described technology is implemented may include a central processing unit, memory, input devices (e.g., keyboard and pointing devices), output devices (e.g., display devices), and storage devices (e.g., disk drives). The memory and storage devices are computer-readable media that may be encoded with data structures and computer-executable instructions that implement the approval system, which means a computer-readable medium that contains the data structures and the instructions. In addition, the instructions, data structures, and message structures may be stored or transmitted via a data transmission medium, such as a signal on a communication link. Various communication links may be used, such as the Internet, a local area network, a wide area network, a point-to-point dial-up connection, a cell phone network, and so on.

Embodiments of the system may be implemented in and used with various operating environments that include personal computers, server computers, hand-held or laptop devices, multiprocessor systems, microprocessor-based systems, programmable consumer electronics, digital cameras, network PCs, minicomputers, mainframe computers, computing environments that include any of the above systems or devices, and so on.

The described technology may be described in the general context of computer-executable instructions, such as program modules, executed by one or more computers or other devices. Generally, program modules include routines, programs, objects, components, data structures, and so on that perform particular tasks or implement particular abstract data types. Typically, the functionality of the program modules may be combined or distributed as desired in various embodiments. As an example, various components or logic of the described technology may be distributed between a numerical control machine and a computing device that is communicably coupled to the numerical control machine, such as via a data communications network or other electronic or electromechanical interface.

Figure 19:
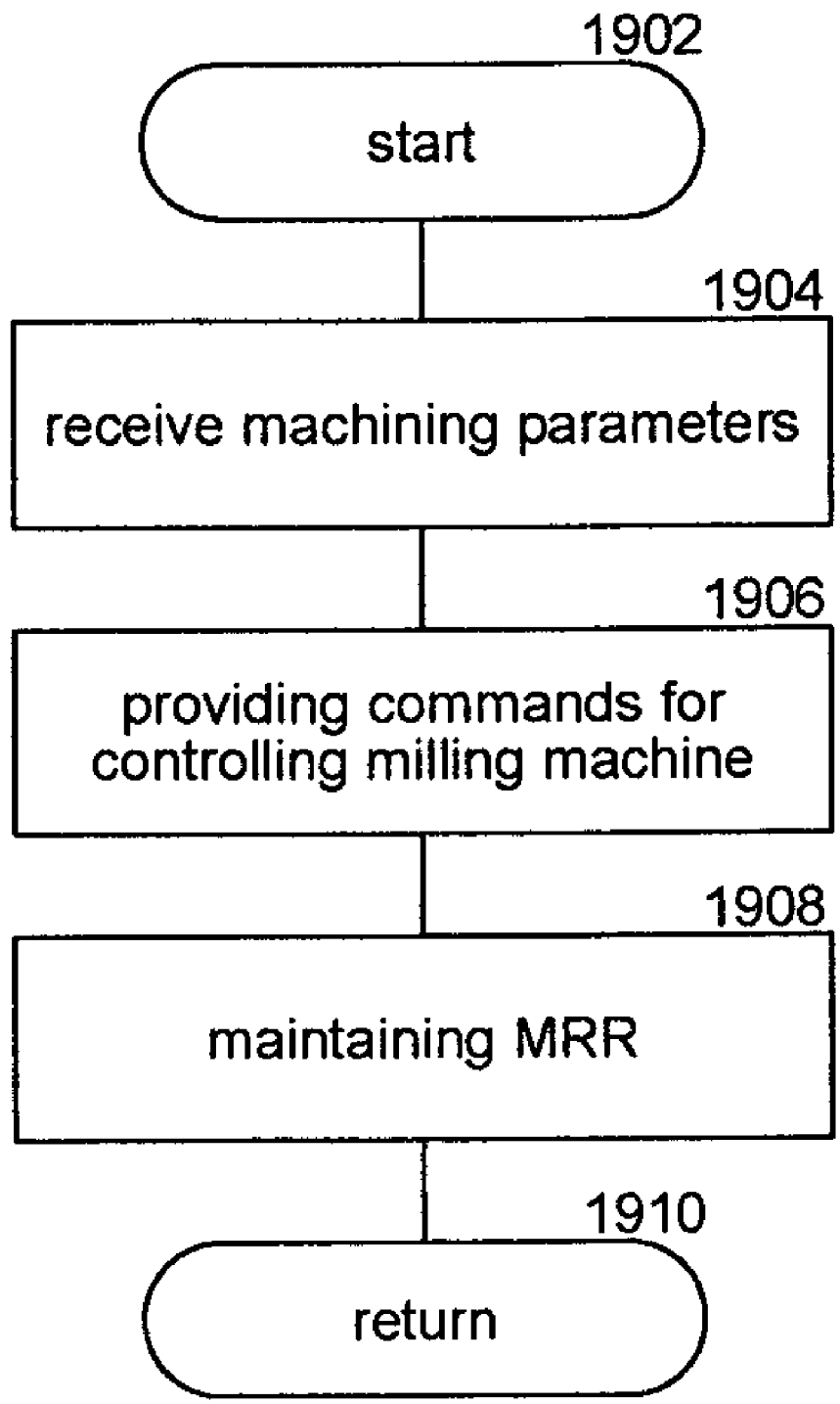
FIG. 19 is a flow diagram illustrating a routine invoked during machining in various embodiments.

FIG. 19 is a flow diagram illustrating a routine invoked to create a toolpath in various embodiments. The routine begins at block 1902. At block 1904, the routine receives machining parameters. As examples, the routine can receive angle of descent, ADOC, RDOC, and feed rate as parameters. At block 1906, the routine provides commands for controlling the milling machine based on the received parameters. As an example, the routine may provide commands to maintain MRR at block 1908 based on the received parameters. The routine returns at block 1910.

Figure 20:
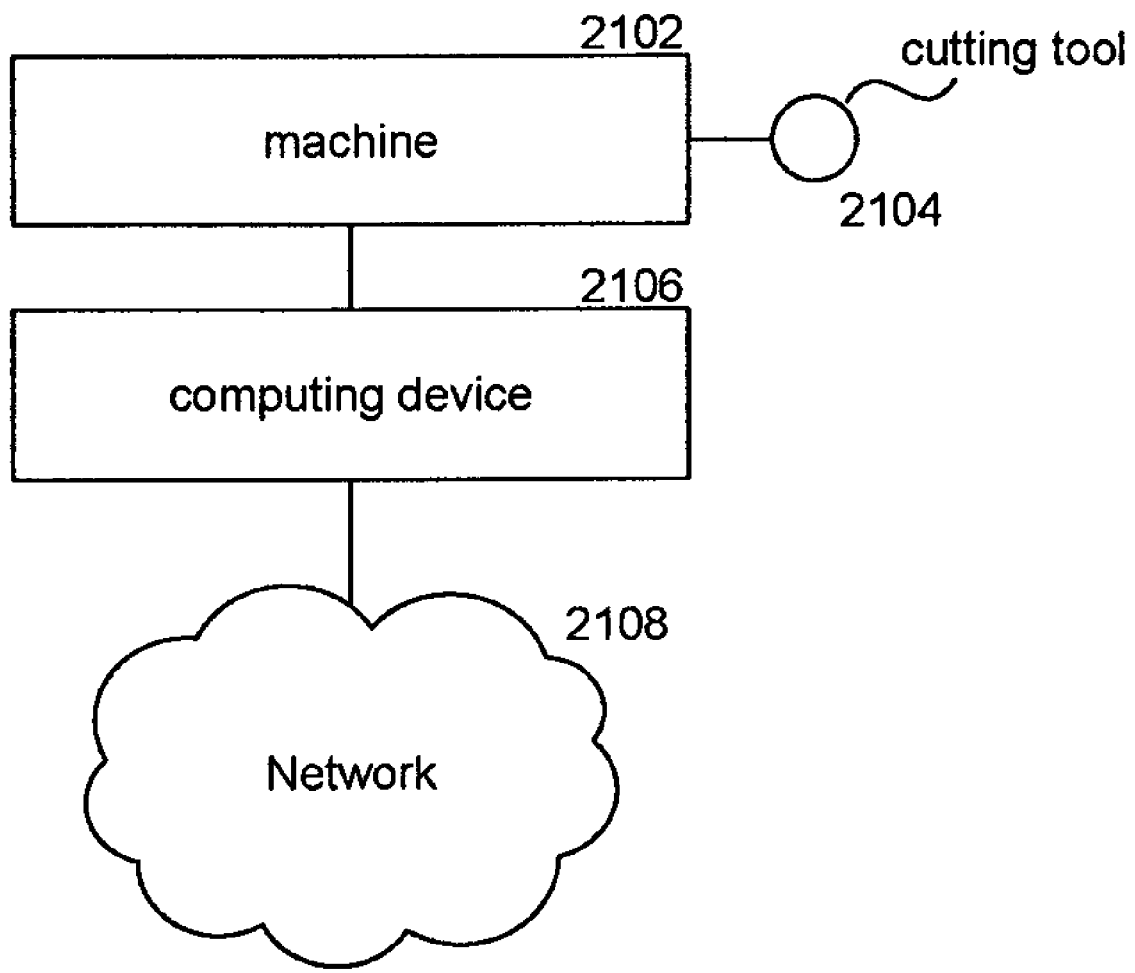
FIG. 20 is a block diagram illustrating components employed during machining in various embodiments.

FIG. 20 is a block diagram illustrating components employed during machining in various embodiments. The components can be implemented in hardware and/or software. The components can include a machine 2102, such as a milling machine. The machine can be associated with a cutting tool 2104. The machine may also be associated with a computing device 2106. The computing device may be communicably coupled with a network 2108, such as an intranet or the Internet. Other computing devices may be connected to the network (not illustrated). An operator (e.g., NC programmer) may use computing device 2106 or other computing devices to configure the machine 2102, such as by specifying various parameters. Alternatively, CAD/CAM systems may provide parameters to the machine. The CAD/CAM systems may operate on the computing device 2106 or another computing device.

In various embodiments, the table moves and the cutting tool is stationary. In various embodiments, the cutting tool moves and the table is stationary. In various embodiments, both the table and the cutting tool move.

In various embodiments, the described technology invokes various methods and employs components implemented in software and/or hardware.

Varied or Altered Aspects

The first embodiment can employ a ramp entry that extends from the center of a local area of the area being machined to being tangent to the outermost offset in that local area. This can result in a Transition Area that crosses an increased number (e.g., a maximum number) of offsets (cuts) of the toolpath, and therefore creates a safe Transition Area for connecting from the end of the greatest possible number of cuts to the beginning of the greatest possible number of cuts in that local area. It may be possible to generate a Transition Area by ramping over a shorter distance to create a Transition Area that is usable for connecting fewer cuts, and then use the second embodiment to lengthen the Transition area, either immediately or after the cuts that cross the Transition Area are traversed. It may also be possible to use the second embodiment to create a Transition Area elsewhere in the area to be machined, and not extend the original Transition Area at all.

This can result in a greater number of Transition Areas, most likely of shorter length, and possibly in different locations throughout the area to be machined. This may be less efficient for machining purposes than the first embodiment, but would be an enhancement to existing toolpath algorithms. Transition Areas provide a safe, predictable, pre-machined transition course from the end of one cut to the beginning of the next. Transition Areas generally cross or intersect one or more offsets, or cuts, of the toolpath.

Additionally, the first embodiment can provide a Transition Area that has parallel, straight sides and full-radius arcs on the ends. The sides could be nonlinear and/or nonparallel, however, and the Transition Area could still be effective. Likewise, the end-radii could be more or less than full, or one or both ends could consist of two 90-degree arcs, for example, connected with a short circular or noncircular curve, and still be effective. The shape of the ends could also be mathematically or geometrically noncircular and the Transition Area could still be effective.

The second embodiment can provide milling Transition Areas such that the toolpath follows constant offsets of the MAT. The offsets can be non-constant, necking inward in certain areas, for example, and still achieve the desired results, provided that the offsets are generally not so far apart that they leave uncut material between them. It would be preferable for the offsets to mirror each other about the MAT, but the described technology can operate without this restriction. Further, the Transition Areas of the second embodiment could be beneficial, though likely less so, if the Transition Areas of the second embodiment were not tied to the MAT. Transition Areas will generally cross, or intersect, the cuts.

Both the first and second embodiments can specify an arc of full radius at the ends of the Transition Areas, with said radii being the result of the cutting tool turning along a radius to reverse directions. When ramping, as in the first preferred embodiment, the Transition Area could be created by a zigzag ramping motion, wherein the tool feeds in one direction while plunging, then, upon reaching the end of the Transition Area, stops and reverses its direction of cut while continuing to plunge in the Z-axis. This may create a narrower Transition Area, equal in width to the diameter of the cutting tool, but a usable Transition Area nonetheless. In the second embodiment, where the cutting tool enters the material from the side after positioning in Z to the first ADOC, the cutting tool could feed to the end of the Transition Area, stop feeding, retract out of the material, reposition back to the beginning of the Transition Area in X-Y, position in Z to the next ADOC, and repeat. This also may create a narrower, though still useful, Transition Area.

The described technology can specify motion in the Transition Areas that follows an "S" shape, or some other smooth, continuous path. A cutting tool could feed into a Transition Area, change direction in an angular, discontinuous fashion, position itself in line with the next cut, and again change direction in an angular, discontinuous fashion to begin the next cut. Further, these angular, discontinuous directional changes could be smoothed with radii of some value less than the radii used to create the smooth motion of the preferred embodiments.

The second embodiment can specify a Transition Area by slot milling the area, perhaps with varying ADOCs and/or feed rates. The Transition Areas could also be milled without slotting, by using a "trochoidal" path, for example, or some other strategy that feeds the tool into the area with substantially circular motion.

The third embodiment can specify offsetting arcs from a partially circular portion of a toolpath resulting from the application of the first and second embodiments. By locating the seeds for these offsets in some other manner, such as rounding the innermost offset in a local area of an area being machined in some way and then offsetting that round outward by the programmed RDOC, the technology can provide results consistent with those described above.

From the foregoing, it will be appreciated that specific embodiments of the invention have been described herein for purposes of illustration, but that various modifications may be made without deviating from the spirit and scope of the described technology. For example, method steps can be performed in various orders, include more or other steps, some steps can be removed, and so forth. Systems can include more or fewer components. The components can be implemented in software and/or hardware.

We claim:

1. A method for milling selected portions of a workpiece by a cutting tool of a numerical control machine, the numerical control machine having associated therewith a processor and a memory, the method comprising:
    receiving a main toolpath, the main toolpath comprising one or more cuts;
    computing one or more transition toolpaths, each transition toolpath defining a transition area intersecting one or more of the cuts of the main toolpath;
    trimming one or more cuts of the main toolpath at substantially two or more points of intersection between the main toolpath and the transition areas;
    connecting the trimmed portions of the main toolpath with one or more connecting moves such that each connecting move is substantially inside one or more of the transition areas wherein the cutting tool is substantially disengaged from the workpiece during the connecting move within the transition areas; and
    milling the selected portions of the workpiece by moving the cutting tool in accordance with the cuts, transition toolpaths, trimmed cuts, and connecting moves.

2. The method of claim 1, wherein at least a first cut of the main toolpath is connected to a second cut of the main toolpath with one or more connecting moves.

3. The method of claim 2, wherein at least one of the transition areas defined by the computed toolpaths includes a center of a local subarea of the portion of the workpiece being milled.

4. The method of claim 3, further comprising determining using a medial axis transform the center of the local subarea.

5. The method of claim 1, wherein one or more of the connecting moves connect from an interruption of a cut to a continuation of the cut.

6. The method of claim 1 further comprising cutting at least one of the transition areas with a ramping motion starting above the workpiece and moving down into the workpiece.

7. The method of claim 1, further comprising cutting at least one of the transition areas with multiple axial depths of cut.

8. The method of claim 1, further comprising cutting at least one of the transition areas by feeding the cutting tool into the at least one transition area with a smooth technique.

9. The method of claim 1, wherein at least one of the transition areas is an offset or a rounded offset of a portion of the medial axis of a specified area.

10. The method of claim 1, further comprising:
    offsetting inwards one or more subsets of a boundary to form a first set of offsets;
    offsetting outwards the first set of offsets one or more times to form a second set of offsets, and
    including portions of the second set of offsets in the main tool path.

11. The method of claim 10, wherein a corner or point of higher curvature on the first set of offsets lies inside one of the transition areas.

12. The method of claim 10 wherein offsetting inwards includes identifying one or more cuts between an outer edge of the workpiece and a center of the workpiece.

13. The method of claim 1 further comprising maintaining a nearly constant material removal rate throughout the milling.

14. The method of claim 1, wherein each of the or more transition toolpaths intersects two or more of the cuts of the main toolpath.

15. A computer-readable storage device storing computer-executable instructions that, when executed, perform a method for milling selected portions of a workpiece by a cutting tool of a numerical control machine, the numerical control machine having associated therewith a processor and a memory, the method comprising:
    receiving a main toolpath, the main toolpath comprising one or more cuts;
    computing one or more transition toolpaths, each transition toolpath defining a transition area intersecting one or more of the cuts of the main toolpath;
    trimming one or more cuts of the main toolpath at substantially two or more points of intersection between the main toolpath and the transition areas;
    connecting the trimmed portions of the main toolpath with one or more connecting moves such that each connecting move is substantially inside one or more of the transition area wherein the cutting tool is substantially disengaged from the workpiece during the connecting move within the transition areas;
    cutting the transition areas of the workpiece in a first pass of the cutting tool; and
    milling the selected portions of the workpiece in a second pass of the cutting tool by moving the cutting tool in accordance with the cuts, transition toolpaths, trimmed cuts, and connecting moves.

16. The computer-readable storage device of claim 15, further comprising:
    offsetting inwards one or more subsets of a boundary to form a first set of offsets;
    offsetting outwards the first set of offsets one or more times to form a second set of offsets, and
    including portions of the second set of offsets in the main tool path.

17. A system for milling selected portions of a workpiece, comprising:
    a cutting tool associated with a numerical control machine;
    a processor and a memory associated with the numerical control machine;
    a component configured to receive a main toolpath, the main toolpath comprising one or more cuts;
    a component configured to compute one or more transition toolpaths, each transition toolpath defining a transition area intersecting one or more of the cuts of the main toolpath;

a component configured to trim one or more cuts of the main toolpath at substantially two or more points of intersection between the main toolpath and the transition areas;

a component configured to connect the trimmed portions of the main toolpath with one or more connecting moves such that each connecting move is substantially inside one or more of the transition areas wherein the cutting tool is substantially disengaged from the workpiece during the connecting move within the transition areas;

a component configured to cause the cutting tool to mill the selected portions of the workpiece by moving the cutting tool in accordance with the cuts, transition toolpaths, trimmed cuts, and connecting moves.

18. The system of claim 17 wherein an angle of descent of the cutting tool is controlled by a parameter wherein a value for the parameter is stored in the memory.

19. The system of claim 17 wherein the component configured to compute the one or more transition toolpaths is further configured to identify at least one subarea and a center of the subarea.

20. The system of claim 17 wherein the cutting tool does not exceed a programmed radial depth of cut.

21. The system of claim 17 wherein the cutting tool does not exceed a specified material removal rate.

22. The system of claim 17 wherein at least one of the component configured to receive a main tool path and the component configured to compute one or more transition toolpaths is associated with a computing device that is communicably coupled to the numerical control machine.

23. The system of claim 17, wherein each of the one or more transition toolpaths intersects two or more of the cuts of the main toolpath.

* * * * *